(12) United States Patent
Goehl et al.

(10) Patent No.: US 11,991,849 B2
(45) Date of Patent: May 21, 2024

(54) HOUSING COVER

(71) Applicant: ElringKlinger AG, Dettingen (DE)

(72) Inventors: Kristian Goehl, Reutlingen (DE); Johannes Hoevemeyer, Dettingen (DE); Bernhard Eberle, Metzingen (DE); Jochen Schoellhammer, Dettingen (DE); Bodo Golchert, Wolfschlugen (DE); Andreas Wolfer, Lenningen (DE)

(73) Assignee: ElringKlinger AG, Dettingen (DE)

( * ) Notice: Subject to any disclaimer, the term of this patent is extended or adjusted under 35 U.S.C. 154(b) by 518 days.

(21) Appl. No.: 17/226,883

(22) Filed: Apr. 9, 2021

(65) Prior Publication Data

US 2021/0227712 A1    Jul. 22, 2021

Related U.S. Application Data

(63) Continuation of application No. PCT/EP2019/077169, filed on Oct. 8, 2019.

(30) Foreign Application Priority Data

Oct. 12, 2018   (DE) ................... 10 2018 125 294.3

(51) Int. Cl.
   *H05K 5/06*   (2006.01)
(52) U.S. Cl.
   CPC .................... *H05K 5/061* (2013.01)
(58) Field of Classification Search
   None
   See application file for complete search history.

(56) References Cited

U.S. PATENT DOCUMENTS

| | | | | |
|---|---|---|---|---|
| 4,449,015 A | * | 5/1984 | Hotchkiss | H02G 3/088 439/522 |
| 4,550,852 A | * | 11/1985 | Laudt | H05K 5/0008 220/327 |
| 5,731,544 A | * | 3/1998 | Burck | H02G 3/14 220/241 |
| 5,864,091 A | * | 1/1999 | Sumida | H02G 3/088 174/50 |

(Continued)

FOREIGN PATENT DOCUMENTS

| | | |
|---|---|---|
| DE | 19704532 | 8/1998 |
| DE | 10 2008 062 681 | 7/2010 |

(Continued)

*Primary Examiner* — Krystal Robinson
(74) *Attorney, Agent, or Firm* — Womble Bond Dickinson (US) LLP

(57) ABSTRACT

To create a housing cover for fixing to a housing, in particular to a power inverter housing, wherein the housing cover is provided with a plurality of fastening means through openings and with a sealing bead that includes an elastomeric material, and wherein the sealing bead is arranged on a seal bearing surface of the housing cover, in which housing cover the course of the sealing bead can be more freely designed and, in particular, laid closer to the fastening means through openings of the housing cover, it is provided that the housing cover includes at least one deformation limiting element, which projects over the seal bearing surface in the same direction as the sealing bead and limits a deformation of the sealing bead in the assembled state of the housing cover.

22 Claims, 19 Drawing Sheets

(56) References Cited

U.S. PATENT DOCUMENTS

| | | |
|---|---|---|
| 2006/0169099 A1 | 8/2006 | Diez |
| 2015/0146347 A1 | 5/2015 | Lee et al. |
| 2017/0127540 A1 | 5/2017 | You et al. |

FOREIGN PATENT DOCUMENTS

| | | |
|---|---|---|
| DE | 10 2012 023 857 | 6/2014 |
| EP | 3163986 | 5/2017 |
| JP | 2015141991 | 8/2015 |

* cited by examiner

HOUSING COVER

CROSS-REFERENCE TO RELATED APPLICATIONS

This application is a continuation of international application number PCT/EP2019/077169, filed on Oct. 8, 2019, which claims the benefit of German application number 10 2018 125 294.3, filed on Oct. 12, 2018, which are incorporated herein by reference in their entirety and for all purposes.

FIELD OF DISCLOSURE

The present invention relates to a housing cover for fixing to a housing, in particular a power inverter housing, wherein the housing cover is provided with a plurality of fastening means through-openings and with a sealing bead, which comprises an elastomeric material, and wherein the sealing bead is arranged on a seal bearing surface of the housing cover.

BACKGROUND OF THE INVENTION

EP 1 683 997 A2 discloses a housing cover, in which a sealing bead made of an elastomeric material is arranged in a groove impressed in the housing cover.

Due to the requirement of providing a groove in the housing cover, the width of which in the non-pressed state of the housing cover has to be greater than the width of the sealing bead, the freedom in the design of the housing cover is limited.

SUMMARY OF THE INVENTION

In accordance with an embodiment of the invention a housing cover of the kind stated at the outset is created, in which the course of the sealing bead can be more freely designed and, in particular, can be laid more closely to the fastening means through-openings of the housing cover.

In accordance with an embodiment of the invention, a housing cover with the features of the preamble of claim 1 is provided, in which the housing cover comprises at least one deformation limiting element, which projects over the seal bearing surface in the same direction as the sealing bead and limits a deformation of the sealing bead in the assembled state of the housing cover.

In the housing cover in accordance with the invention, in the assembled state of the housing cover, in which the sealing bead is pressed between the housing cover and the housing to be closed by means of the housing cover, the deformation limiting element is in the main force fit and the sealing bead is in the secondary force fit. This prevents an excessive deformation of the sealing bead.

The at least one deformation limiting element can be produced by reshaping a, preferably metallic, base body of the housing cover, for example by means of a stamping operation or a deep-drawing operation.

The deformation limiting element may be topographical, i.e. the height H of the deformation limiting element (wherein the height of an element refers to its extent in the normal direction of the seal bearing surface) may vary in a longitudinal direction of the deformation limiting element. In particular, provision may be made for the height H of the deformation limiting element to vary in dependence on the respective distance from the nearest fastening means through-opening.

Here, provision is preferably made for the height H of the deformation limiting element to increase with increasing distance from the nearest fastening means through-opening. As a result of the topography of the deformation limiting element designed in that way, the variation of the surface pressure with which the housing cover is braced by means of the fastening means, in particular fastening screws, passing through the fastening means through-openings, in the longitudinal direction of the sealing bead, which is caused by the varying distances of the respective nearest fastening means, is at least partially equalized and thus an even abutment of the sealing bead on the housing to be closed is achieved at every point of the sealing bead.

The topography of the deformation limiting element is preferably produced in the reshaping operation, by means of which the deformation limiting element is formed on the base body of the housing cover.

In a preferred embodiment of the invention, provision is made for at least one portion of at least one deformation limiting element to extend along the circumferential direction of a fastening means through-opening by a circumferential angle of at least 160°, in particular at least 240°, around the fastening means through-opening.

Further, provision may be made for the portion of at least one deformation limiting element to extend along the circumferential direction of the fastening means through-opening by a circumferential angle of less than 360°, in particular less than 300°, particularly preferably less than 240°, around the respective fastening means through-opening.

Alternatively or in addition hereto, provision may be made for at least one portion of at least one deformation limiting element to extend around a fastening means through-opening in an annularly closed manner.

In a preferred embodiment of the invention, provision is made for at least one portion of at least one deformation limiting element to be arranged on a side of a fastening means through-opening facing away from the sealing bead.

In particular, provision may be made for the at least one portion of the at least one deformation limiting element to be arranged between the fastening means through-opening and an outer rim of the housing cover.

On the housing cover a plurality of deformation limiting elements may be provided, which extend along a peripheral direction of the housing cover and are spaced at a distance from one another along the peripheral direction of the housing cover.

In such an embodiment, a sealing bead is associated with the deformation limiting element only in parts; in this case, at least a portion of the sealing bead does not run adjacent and/or parallel to a deformation limiting element of the housing cover.

The sealing bead is preferably of annularly closed configuration.

A region of the seal bearing surface surrounded by the sealing bead is preferably of substantially planar configuration.

In particular, provision may be made for the entire region of the seal bearing surface surrounded by the sealing bead to be of substantially planar configuration.

The deformation limiting element may comprise a projection extending in a longitudinal direction of the deformation limiting element.

Such a projection may be configured as a bead, in particular as a full bead.

Further, provision is preferably made for a recess on the outside of the housing cover, in particular a, preferably metallic, base body of the housing cover, said outside facing away from the seal bearing surface, to be associated with the deformation limiting element.

Here, at least one fastening means through-opening of the housing cover opens into a recess that is associated with a deformation limiting element. In this case, the recess reaches directly up to the rim of the fastening means through-opening.

Further, provision may be made for the deformation limiting element to also reach directly up to the rim of the fastening means through-opening.

A fastening means, for example a fastening screw, passing through a fastening means through-opening in the assembled state of the housing cover can abut on a recess surrounding the fastening means through-opening, in particular on a base of the recess, for example with a head of the fastening means, for example of the fastening screw, preferably with substantially the entire shank-side abutment surface of the head.

The deformation limiting element in the assembled state of the housing cover may be arranged entirely or partially between the fastening means, in particular a head of the fastening means, for example of a fastening screw, and the housing to be closed by means of the housing cover. In this case, the deformation limiting element is pressed by the fastening means directly on block.

The sealing bead in the assembled state of the housing cover may be arranged entirely or partially in the region between a head of the fastening means, for example of a fastening screw, and the housing to be closed by means of the housing cover. As a result, a particularly high contact pressure acting on the sealing bead and thus a high sealing force is achieved.

The sealing bead may be arranged such that it, seen in a Z-direction oriented perpendicularly to the seal bearing surface, is overlapped across its entre width b or across part of its width b by a portion of the recess surrounding the fastening means through-opening.

The deformation limiting element may have a reduced width B" in a region, which is located between a fastening means through-opening on the one hand and the sealing bead on the other hand, which makes it possible to bring the sealing bead there as close as possible to the respective fastening means through-opening.

In such a region, the deformation limiting element may have a substantially rectilinear rim, preferably running substantially in parallel to the sealing bead.

The recess associated with the deformation limiting element and extending around the same fastening means through-opening may comprise a (preferably circular segment-shaped) region, which, seen in the Z-direction, does not overlap with the deformation limiting element.

To avoid that the reduced width B" of the deformation limiting element in the aforementioned region leads to an inadmissibly high surface pressure in the assembled state of the housing cover, provision may be made for another region of the deformation limiting element, which extends around the same fastening means through-opening, to have a greater width, and/or for the deformation limiting element to comprise a region, which in a direction running substantially parallel to the sealing bead adjoins the region of the deformation limiting element that has a reduced width.

A portion of a deformation limiting element, which extends along a circumferential direction of a fastening means through-opening entirely or partially around a respective fastening means through-opening, may have a maximum width B and a minimum width B". The width B or B" hereby corresponds to the distance between an inner rim facing toward the fastening means through-opening and an outer rim of the portion of the deformation limiting element, facing away from the fastening means through-opening.

The inner rim of the portion of the deformation limiting element may hereby coincide with the rim of the fastening means through-opening.

The maximum width B of the portion of the deformation limiting element is preferably at most 100% of the diameter of the fastening means through-opening, in particular at most 60% of the diameter of the fastening means through-opening, particularly preferably at most 20% of the diameter of the fastening means through-opening.

The minimum width B" of the portion of the deformation limiting element is preferably less than 50% of the maximum width B of the portion of the deformation limiting element.

A rim portion connecting the inner rim and the outer rim of the portion of the deformation limiting element to one another may be arranged substantially tangentially to the fastening means through-opening. In this case, the minimum width B" of the portion of the deformation limiting element is equal to zero.

The inner rim of the portion of the deformation limiting element may extend over a circumferential angle $\alpha$ (in relation to the central axis of the fastening means through-opening) of 360° or less, preferably 320° or less, in particular 270° or less, particularly preferably 180° or less.

The outer rim of the portion of the deformation limiting element may extend over a circumferential angle $\beta$ (in relation to the central axis of the fastening means through-opening) of 360° or less, preferably 320° or less, in particular 270° or less, particularly preferably 180° or less.

The circumferential angle $\alpha$ along which the inner rim of the portion of the deformation limiting element extends around the fastening means through-opening may be substantially equal to the circumferential angle $\beta$ along which the outer rim of the portion of the deformation limiting element extends around the fastening means through-opening. In this case, the rim portions, which connect the inner rim and the outer rim of the portion of the deformation limiting element to one another, may be oriented substantially radially to the central axis of the fastening means through-opening.

In particular embodiments of the deformation limiting element, however, provision is made for the circumferential angle $\alpha$ to be greater than the circumferential angle $\beta$. In this case, the rim portions of the deformation limiting element, which connect the inner rim to the outer rim of the deformation limiting element, are oriented non-radially in relation to the central axis of the fastening means through-opening.

In particular, provision may be made for the rim portions of the portion of the deformation limiting element, which connect the inner rim and the outer rim of the portion of the deformation limiting element to one another, to be oriented substantially in parallel to the sealing bead.

The distance d of the sealing bead from the rim portions of the portion of the deformation limiting element is preferably at least 0.5 mm, in particular at least 0.7 mm, particularly preferably at least 1.0 mm.

If the portion of the deformation limiting element does not extend completely around the fastening means through-opening, the distance d' of the sealing bead from the rim of the fastening means through-opening is preferably smaller in sections than the distance d of the sealing bead from the deformation limiting element.

In this case, the distance d' of the sealing bead from the rim of the fastening means through-opening is preferably at least 0.5 mm, in particular at least 0.7 mm, particularly preferably at least 1.0 mm.

In a preferred embodiment of the invention, provision is made for the sealing bead to run at least in sections at a distance d from the deformation limiting element, which distance is smaller than the width b of the sealing bead and/or is smaller than the width B of the deformation limiting element.

The width of the deformation limiting element is preferably smaller than four times, in particular smaller than three times, particularly preferably smaller than twice the width b of the sealing bead.

The seal bearing surface preferably comprises a substantially planar region, which bears the sealing bead and on the side of the sealing bead facing away from the deformation limiting element has a width, which is greater than the width b of the sealing bead.

A base body of the housing cover, on which the sealing bead is arranged, is preferably configured as a shaped sheet metal part.

A metallic base body of the housing cover, on which the sealing bead is arranged, preferably comprises aluminum or an aluminum alloy.

To stiffen the housing cover in the region of the outer rim of the housing cover, provision may be made for a rim region of the housing cover running on the side of the deformation limiting element facing away from the sealing bead to have a bend.

Provision may thereby be made for the rim region of the housing cover to be bent away from the side of a base body of the housing cover that bears the sealing element, or to be bent toward the side of the base body of the housing cover that bears the sealing element.

Such a rim region of the housing cover provided with a bend may be convexly or concavely curved, seen from the side of the base body that bears the sealing element.

Further features and advantages of the invention are the subject matter of the subsequent description and the illustrative depiction of an exemplary embodiment.

BRIEF DESCRIPTION OF THE DRAWINGS

The same or functionally equivalent elements are provided with the same reference numerals all Figures.

DETAILED DESCRIPTION OF THE INVENTION

Figure 1:
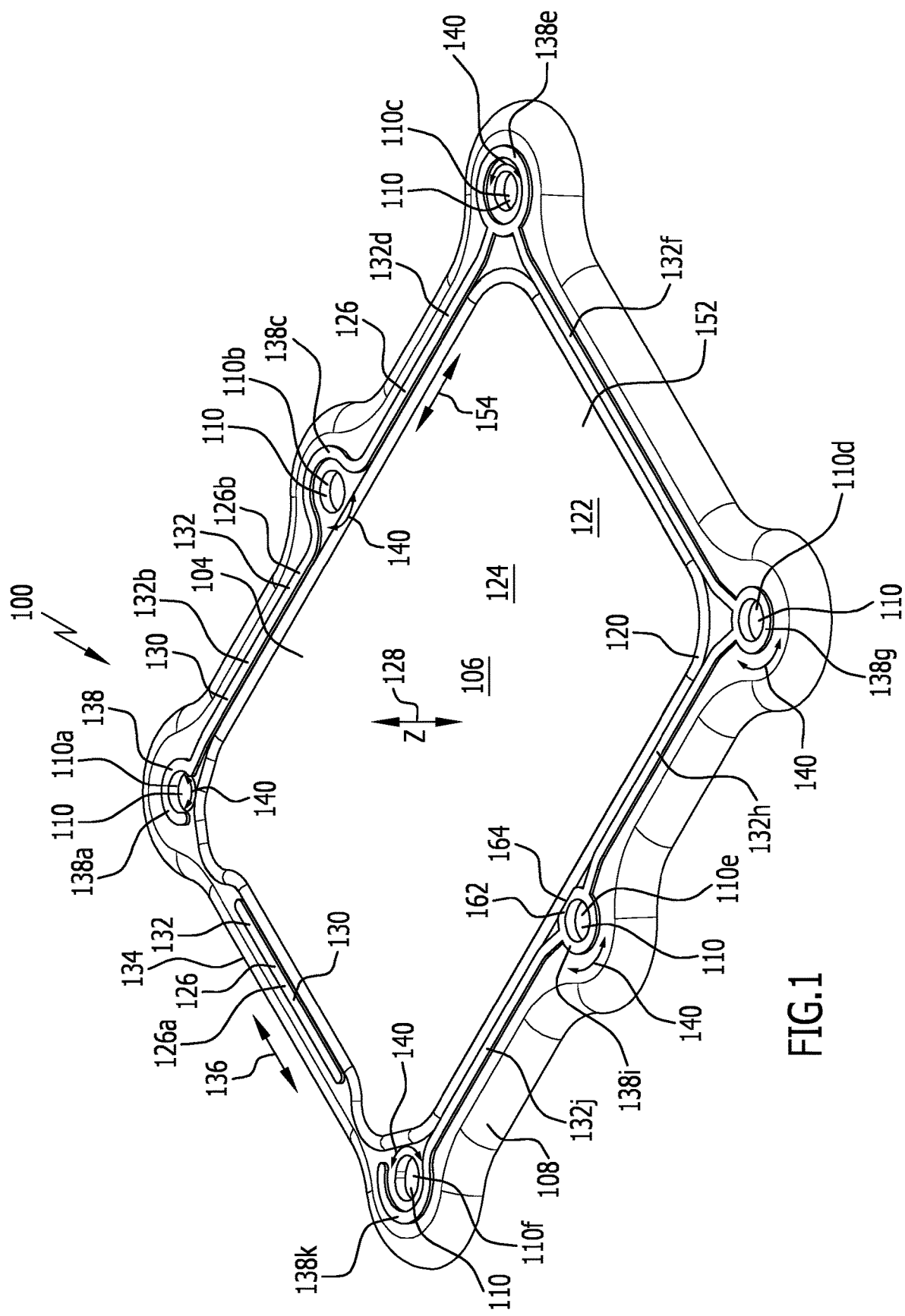
FIG. 1 shows a perspective depiction of a housing cover, with the viewing direction toward an inside of the housing cover provided with a sealing bead and deformation limiting elements.

A housing cover, depicted in FIGS. 1 to 15 and designated as a whole with 100, is provided for closing a housing opening on a housing 102, for example on a housing of a power inverter, in particular of a power inverter of a drive device for an electric car.

The housing cover 100 depicted for example in the drawings is of substantially rectangular configuration and comprises a metallic base plate 104 with a substantially planar central region 106 and with a curved rim region 108, which has a bend with a bend angle of preferably more than 60°, for example of substantially 90°, for stiffening the housing cover 100 at its outer rim.

The rim region 108 may, in principle, be bent toward the housing 102 to be closed or away from the hosing 102 to be closed; in the depicted embodiment the curved rim region is bent away from the housing 102 to be closed by means of the housing cover 100.

Along the outer periphery of the central region 106 of the housing cover 100, in the vicinity of the transition to the curved rim region 108, the housing cover 100 is provided with a plurality of fastening means through-openings 110, six in the present embodiment, which follow one another along the periphery of the housing cover at a distance from one another.

These fastening means through-openings 110 serve in the assembly of the housing cover 100 on the housing 102 to be closed to receive the shanks 112 of fastening screws 114 (see FIGS. 5, 7, 10, 13, and 15, which depict the housing cover 100 in its state assembled on the housing 102 by means of the fastening screws 114), which extends through the fastening means through-openings 110 and are screwed with their external threads into corresponding internal threads of threaded holes 116 in fastening means assembly regions 118 of the housing 102 to be closed.

For achieving a fluid-tight seal between the housing cover 100 and the housing 102 to be closed, a sealing bead 120 is provided, which is arranged on an inside of the housing 100 that in the assembled state of the housing cover 100 faces toward the inner space of the housing 102 to be closed and that forms a seal bearing surface 122 of the housing cover 100.

The sealing bead 120 is preferably of annularly closed configuration.

A region 124 of the seal bearing surface 122 surrounded by the sealing bead 120 and bounded by the sealing bead 120 is preferably of substantially planar configuration.

In particular, provision may be made for the entire region 124 of the seal bearing surface 122 surrounded by the sealing bead 120 to be of substantially planar configuration.

The sealing bead 120 is made of an elastomeric material, for example of a silicone material, and can be formed, for example, by application by means of a dispenser (in a so-called "cured in place" method) or by a screen printing method on the seal bearing surface 122.

When assembling the housing cover 100 on the housing 102 by means of the fastening screws 114, the sealing bead 120 is pressed by tightening the fastening screws 114 in the threaded holes 116 of the fastening means assembly regions 118 of the housing 102, the height h of the sealing bead 120, i.e. its extent perpendicular to the seal bearing surface 122, being reduced to a value h'.

The elastic restoring force of the elastomeric sealing bead 120 then produces the sealing force with which the sealing bead 120 sealingly abuts on the housing 102.

To avoid excessive deformation of the sealing bead 120, the housing cover 100 comprises one or more deformation limiting element 126, which project over the seal bearing surface 122 in the same direction, namely in a Z-direction 128 oriented perpendicular to the seal bearing surface 122, as the sealing bead 120 and limit a deformation of the sealing bead 120 in the assembled state of the housing cover 100.

Each deformation limiting element 126 is configured to be stiffer than the sealing bead 120, preferably substantially rigid, such that the height h' of the sealing bead 120 in the pressed state thereof is limited at the bottom by the height H of the deformation limiting element 126 over the seal bearing surface 122.

Each of the deformation limiting elements 126 is preferably produced on the metallic base plate 104 of the housing cover 100, which forms a base body 152 of the housing cover 100, by means of a reshaping operation, in particular a stamping operation or a deep-drawing operation.

Each deformation limiting element 126 is configured, for example, as a projection 130 that extends in a longitudinal direction 154 of the projection 130 and that preferably comprises one or more portions 132, which extend substantially in parallel to an outer rim 134 along a peripheral direction 136 of the housing cover 100, and/or one or more portions 138, which extend substantially along a circumferential direction 140 of a respective fastening means through-opening 110.

Each portion 138 of a deformation limiting element 126 can thereby extend along the circumferential direction 140 of the respective fastening means through-opening 110 over a circumferential angle of at least 120°, preferably at least 180°, in particular at least 240°.

Further, provision made be made for a portion 138 of a deformation limiting element 126 to extend around a fastening means through-opening 110 in an annularly closed manner.

Figure 2:
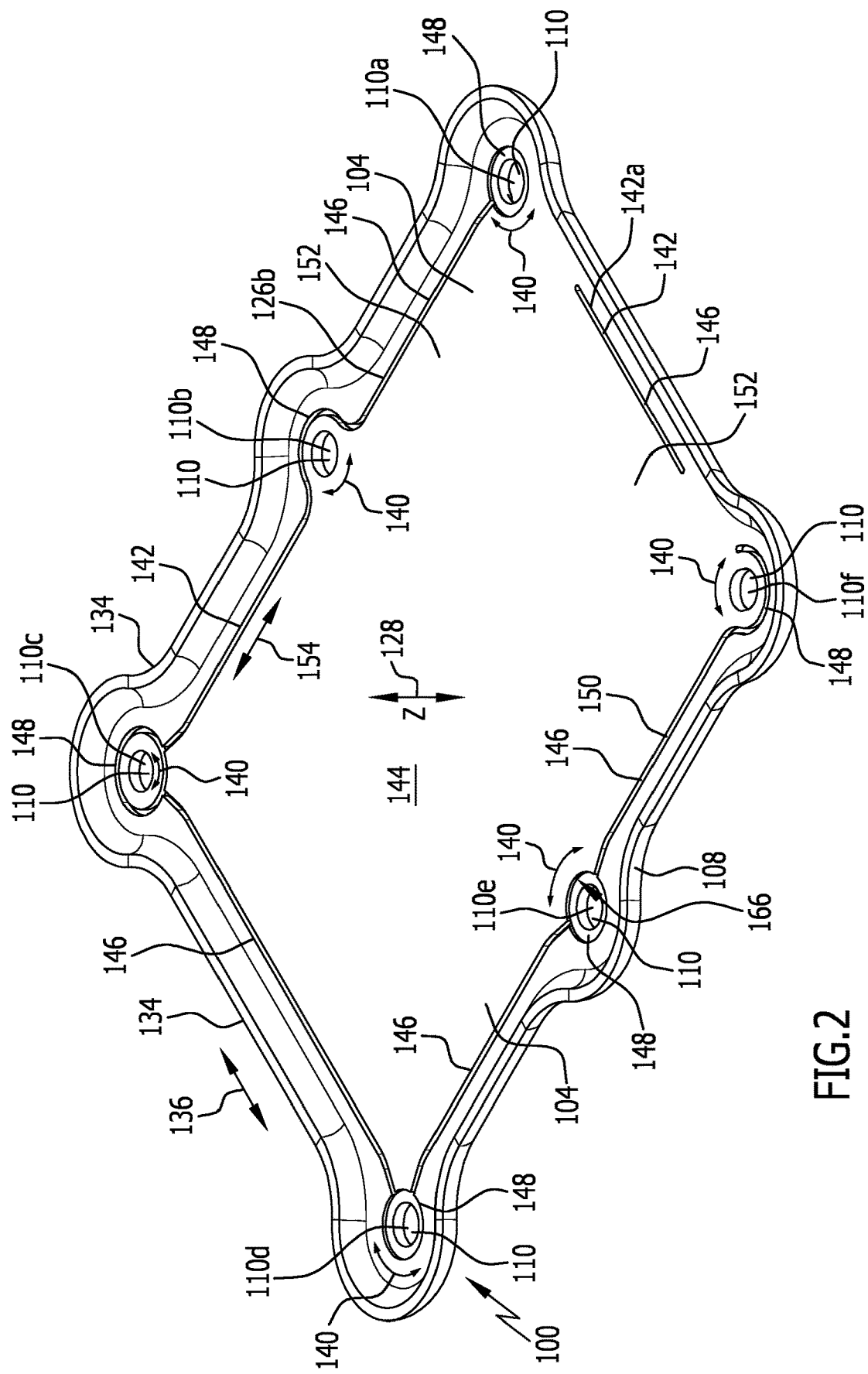
FIG. 2 shows a perspective depiction of the housing cover from FIG. 1, with the viewing direction toward an outside of the housing cover provided with recesses.
Figure 4:
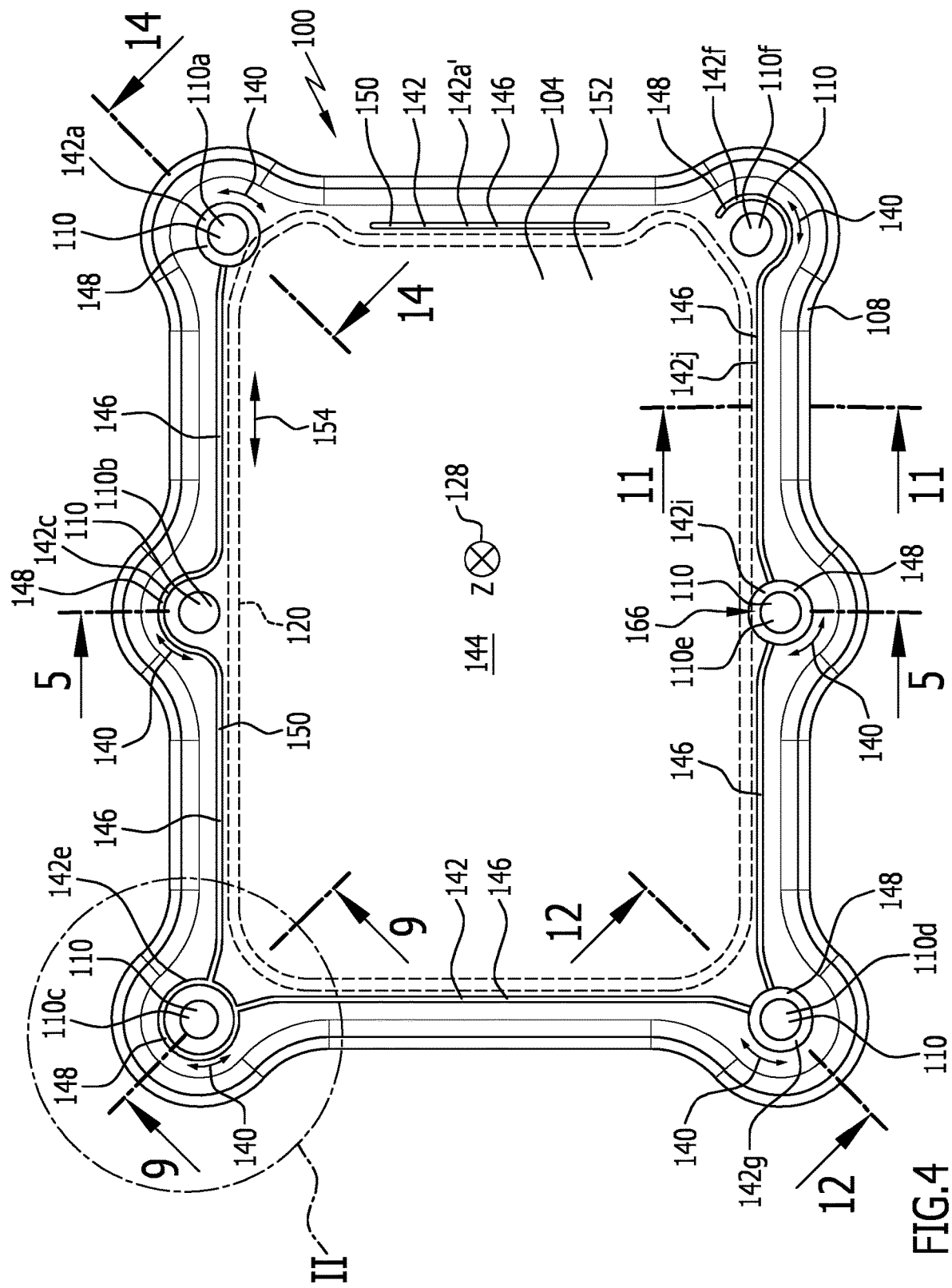
FIG. 4 shows a plan view of the outside of the housing cover provided with the recesses.

Because each deformation limiting element 126 is preferably produced by means of a reshaping operation in which the total volume of the material of the metallic base plate 104 of the housing cover 100 is substantially maintained, each deformation limiting element 126 configured as a projection on the seal bearing surface 122 is associated with a recess 142, which is formed on the outside 144 of the housing cover 100 facing away from the seal bearing surface 122 of the housing cover 100 (see. FIGS. 2 and 4).

As can be seen in FIG. 2, each recess 142 associated with a deformation limiting element 126 may also have one or more portions 146, which extend along the peripheral direction 136 of the housing cover 100 substantially in parallel to the outer rim 134 of the housing cover 100, and have one or more portions 148, which extend along the circumferential direction 140 of a fastening means through-opening 110.

Each portion 148 of a recess 142 can thereby extend along the circumferential direction 140 of a fastening means through-opening 110 over a circumferential angle of at least 120°, preferably at least 180°, in particular at least 240°.

Further, provision made be made for a portion 148 of a recess 142 to extend around a fastening means through-opening 110 in an annularly closed manner.

The portions 146, 148 of a recess 142 on the outside 144 of the housing cover 100 may be configured, in particular, as a groove 150.

Figure 11:
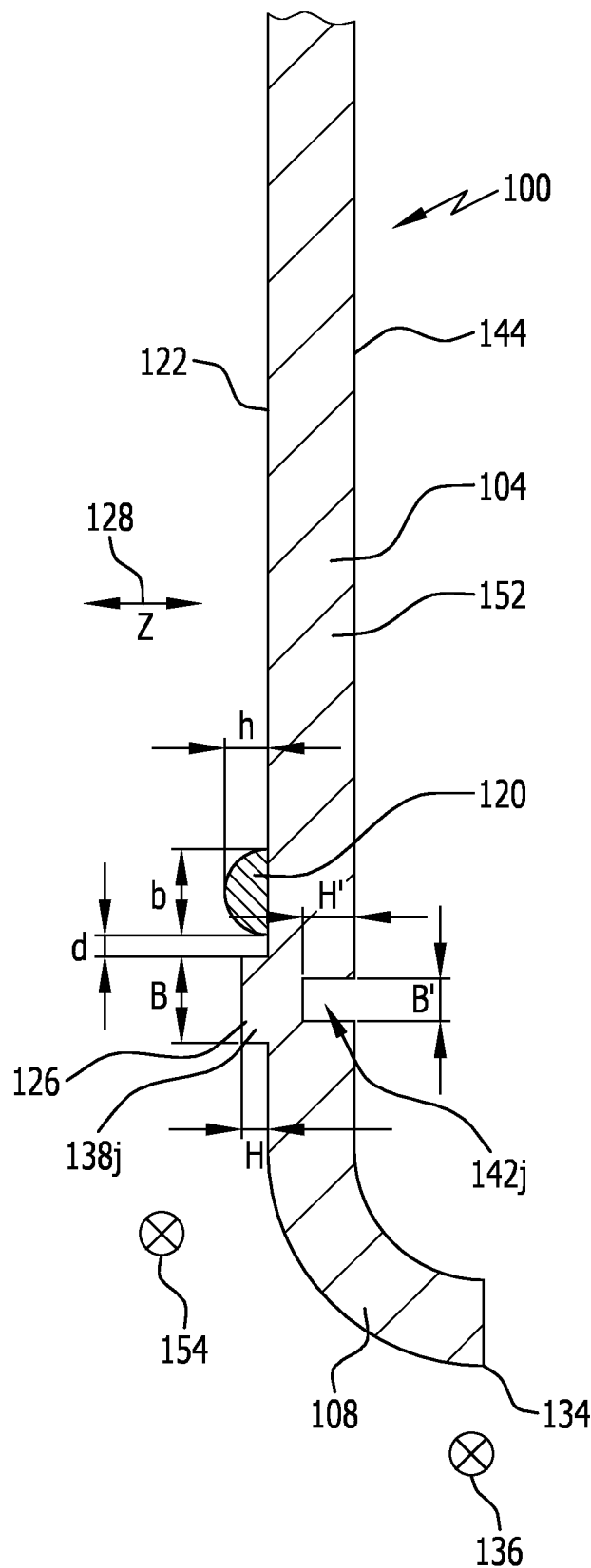
FIG. 11 shows a sectional cross section through the housing cover along line 11-11 in FIG. 4, in a non-pressed state of the sealing bead.

As can be seen, for example, in FIG. 11, the width B' of a recess 142 that is associated with a deformation limiting element 126 may deviate from the width B of the deformation limiting element 126.

The depth H' of the recess 142, i.e. its extent in the Z-direction 128 oriented perpendicularly to the seal bearing surface 122, may also deviate from the height H of the associated deformation limiting element 126.

As shown in FIG. 11, in particular, the width B' of the recess 142 may be smaller than the width B of the associated deformation limiting element 126.

Further, the depth H' of the recess 142 may be greater than the height H of the associated deformation limiting element 126.

Alternatively hereto, provision may also be made for the width B' of the recess 142 to be greater than the width B of the associated deformation limiting element 126.

Further, provision could be made for the depth H' of the recess 142 to be smaller than the height H of the associated deformation limiting element 126.

The width B' and the depth H' of the recess 142 as well as the width B and the height H of the associated deformation limiting element 126 can be set in the desired manner through the design of the tool parts used for the reshaping operation in which the deformation limiting element 126 and the associated recess 142 are produced.

It is thus also possible, in particular, to configure the recess 142 and the associated deformation limiting element 126 in such a way that the width B' of the recess 142 corresponds substantially to the width B of the associated deformation limiting element 126 and/or that the depth H' of the recess 142 corresponds substantially to the height H of the associated deformation limiting element 126.

To ensure that the deformation limiting element 126 effectively limits the compression of the sealing bead 120, it is favorable if the sealing bead 120 runs at least in sections at a distance d from the respectively adjacent deformation limiting element 126, which distance is smaller than the width B of the deformation limiting element 126 and/or smaller than the width b of the sealing bead 120, in particular the width b of the sealing bead 120 in the non-pressed state.

Further, provision is preferably made for the width B of the deformation limiting element 126 to be smaller than four times, in particular smaller than three times, particularly preferably smaller than twice the width b of the respectively adjacent portion of the sealing bead 120.

In a preferred embodiment of the invention, provision is made for the width B of the deformation limiting element 126 to be substantially equal to the width b of the sealing bead 120.

The seal bearing surface 122 preferably comprises a substantially planar region, which bears the sealing bead 120 and has on the side facing away from the deformation limiting element 126 a width that is greater than the width b of the sealing bead 120.

This ensures that the desired reduction of the height h of the sealing bead 120 to the height H of the deformation limiting element 126 upon pressing the housing cover 100 on the housing 102 is not hindered by a structure on the seal bearing surface 122 arranged on the side of the sealing bead 120 facing away from the deformation limiting element 126.

The base plate 104 of the housing cover 100 forms the base body 152, which is preferably configured as a shaped sheet metal part.

The base body 152 of the housing cover 100 may, in particular, comprise aluminum or an aluminum alloy.

To ensure a uniform abutment of the housing cover 100 on the housing 102 to be closed, each deformation limiting element 126 may be provided with a so-called "topography", i.e. the portions 132 of the respective deformation limiting element 126 located between two respective fastening means through-openings 110 are configured such that they have a height H over the seal bearing surface 122 that varies in the longitudinal direction 154 of the deformation limiting element 126, the height H of the respective deformation limiting element 126 preferably increasing with increasing distance from the nearest fastening means through-opening 110.

As a result of the topography of the deformation limiting element 126 designed in that way, the variation of the surface pressure with which the housing cover 100 is braced against the housing 102 to be closed in the longitudinal direction of the sealing bead 120, which is caused by the varying distances from the respective nearest fastening screw 114, is at least partially equalized and thus a uniform abutment of the sealing bead 120 on the housing 102 to be closed is achieved at every point of the sealing bead 120.

This topography of the deformation limiting element 126 is preferably produced during the reshaping operation, in which the respective deformation limiting element 126 is formed.

The embodiment of a housing cover 100 depicted in FIGS. 1 to 15 comprises different forms of deformation limiting elements 126 and different embodiments for the portions 132 and 138 of such a deformation limiting element 126, which are described in detail in the following.

In principle, it is possible to combine these different embodiments of deformation limiting elements 126 and portions 132 and 138 of such deformation limiting elements 126 with one another on a housing cover 100 in any manner.

In particular, provision may also be made for only one single kind of deformation limiting elements 126 and/or only one single kind of portions 132 of a deformation limiting element 126 and/or only one single kind of portions 138 of deformation limiting elements 126 to be present on a housing cover 100.

The graphically represented embodiment comprises two kinds of deformation limiting elements 126, namely a first deformation limiting element 126a that has as an example only one single portion 132, which extends in the region between two fastening means through-openings 110a and 110f (see FIG. 1) along the circumferential direction 136 of the housing cover 100 substantially in parallel to the outer rim 134 of the housing cover 100.

This portion 132 is of substantially rectilinear configuration and preferably ends at its two end at a distance from the respective nearest fastening means through-opening 110a or 110b.

Associated with this first deformation limiting element 126a is a first recess 142a' arranged on the outside 144 of the housing cover 100, which recess also has only one portion 146, preferably of substantially rectilinear configuration, that extends along the peripheral direction 136 of the housing cover 100 and substantially in parallel to the outer rim 134 of the housing cover 100.

The first recess 142a' preferably ends and its two ends at a distance from the respective nearest fastening means through-opening 110a and 110b, respectively.

The width B' of the first recess 142a' is preferably smaller than the width B of the first deformation limiting element 126a.

The depth H' of the first recess 142a' is preferably greater than the height H of the first deformation limiting element 126a.

The embodiment for a housing cover 100 depicted in the drawings further comprises a second deformation limiting element 126b, which as an example comprises the following portions:

a first portion 138a, which extends over a circumferential angle of preferably more than 240° and preferably less than 300° around the first fastening means through-opening 110a;

a second portion 132*b* extending substantially along the peripheral direction 136 of the housing cover 100 between the first fastening means through-opening 110*a* and a second fastening means through-opening 110*b*;

a third portion 138*c* extending along the circumferential direction 140 over a circumferential angle of about 180° around the second fastening means through-opening 110*b*;

a fourth portion 132*d* extending in the region between the second fastening means through-opening 110*a* and a third fastening means through-opening 110*c* along the peripheral direction 136 of the housing cover 100;

a fifth portion 138*e* extending along the circumferential direction 140 of the third fastening means through-opening 110*c* in an annularly closed manner around the third fastening means through-opening 110*c*;

a sixth portion 132*f* extending in the region between the third fastening means through-opening 110*c* and a fourth fastening means through-opening 110*d* along the peripheral direction 136 of the housing cover 100;

a seventh portion 138*g* extending along the circumferential direction 140 of the fourth fastening means through-opening 110*d* in an annularly closed manner around the fourth fastening means through-opening 110*d*;

an eighth portion 132*h* extending between the fourth fastening means through-opening 110*d* and a fifth fastening means through-opening 110*e* along the peripheral direction 136 of the housing cover 100;

a ninth portion 138*i* extending along the circumferential direction 140 of the fifth fastening means through-opening 110*e* in an annularly closed manner around the fifth fastening means through-opening 110*e*;

a tenth portion 138*j* extending between the fifth fastening means through-opening 110*e* and a sixth fastening means through-opening 110*f* along the peripheral direction 136 of the housing cover 100; and an eleventh portion 138*k* extending along the circumferential direction 140 of the sixth fastening means through-opening 110*f* over a circumferential angle of preferably at least 180° and preferably less than 300° around the sixth fastening means through-opening 110*f*.

The second deformation limiting element 126*b* ends in the first portion 138*a* and in the eleventh portion 138*k* in each case at a distance from the respectively facing ends of the first deformation limiting element 126*a*.

Figure 3:
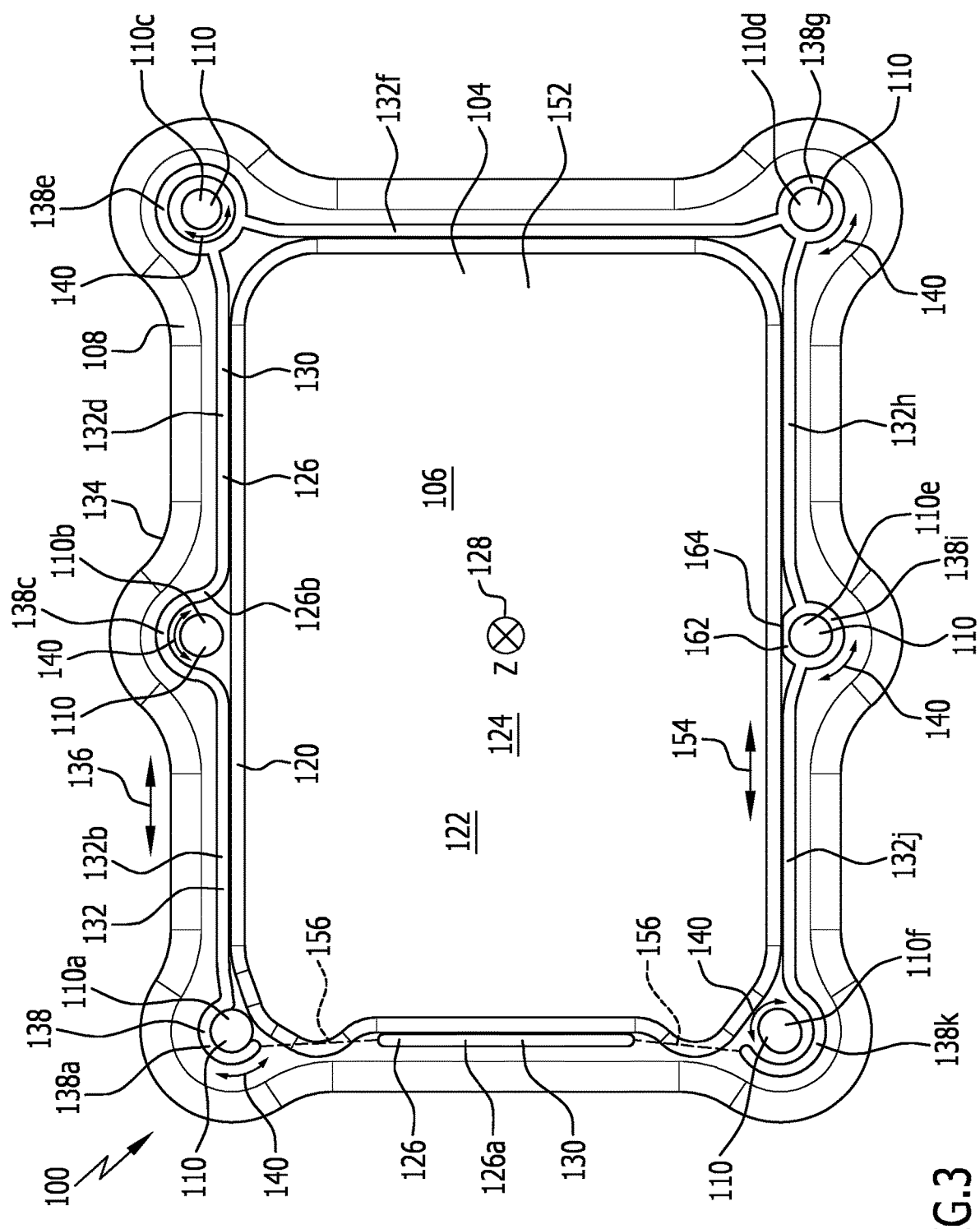
FIG. 3 shows a plan view from above of the inside of the housing cover provided with the sealing bead and the deformation limiting elements.

As can be seen in particular in FIG. 3, the sealing bead 120 thereby preferably crosses the connecting lines 156, depicted broken in FIG. 3, between the end points of the first deformation limiting element 126*a* and the end points of the second deformation limiting element 126*b*, which results in the deformation limiting elements 126*a*, 126*b* adjacent to these regions of the sealing bead 120 exerting a highest possible deformation limiting effect on the sealing bead 120 even in the region of the periphery of the housing cover 100 in which no deformation limiting element 126 is formed.

Figure 14:
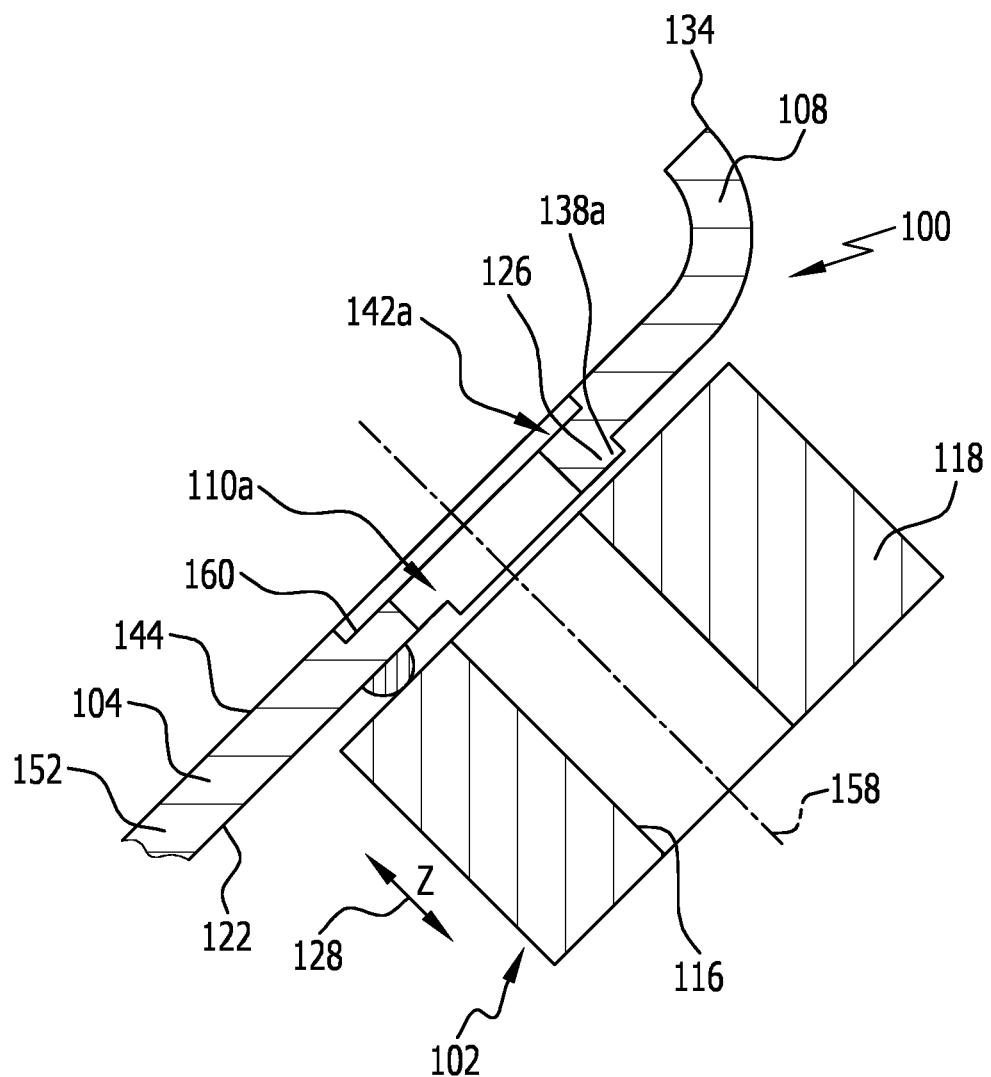
FIG. 14 shows a sectional cross section through the housing cover and a region of the housing along line 14-14 in FIG. 4, in a non-pressed state of the sealing bead.
Figure 15:
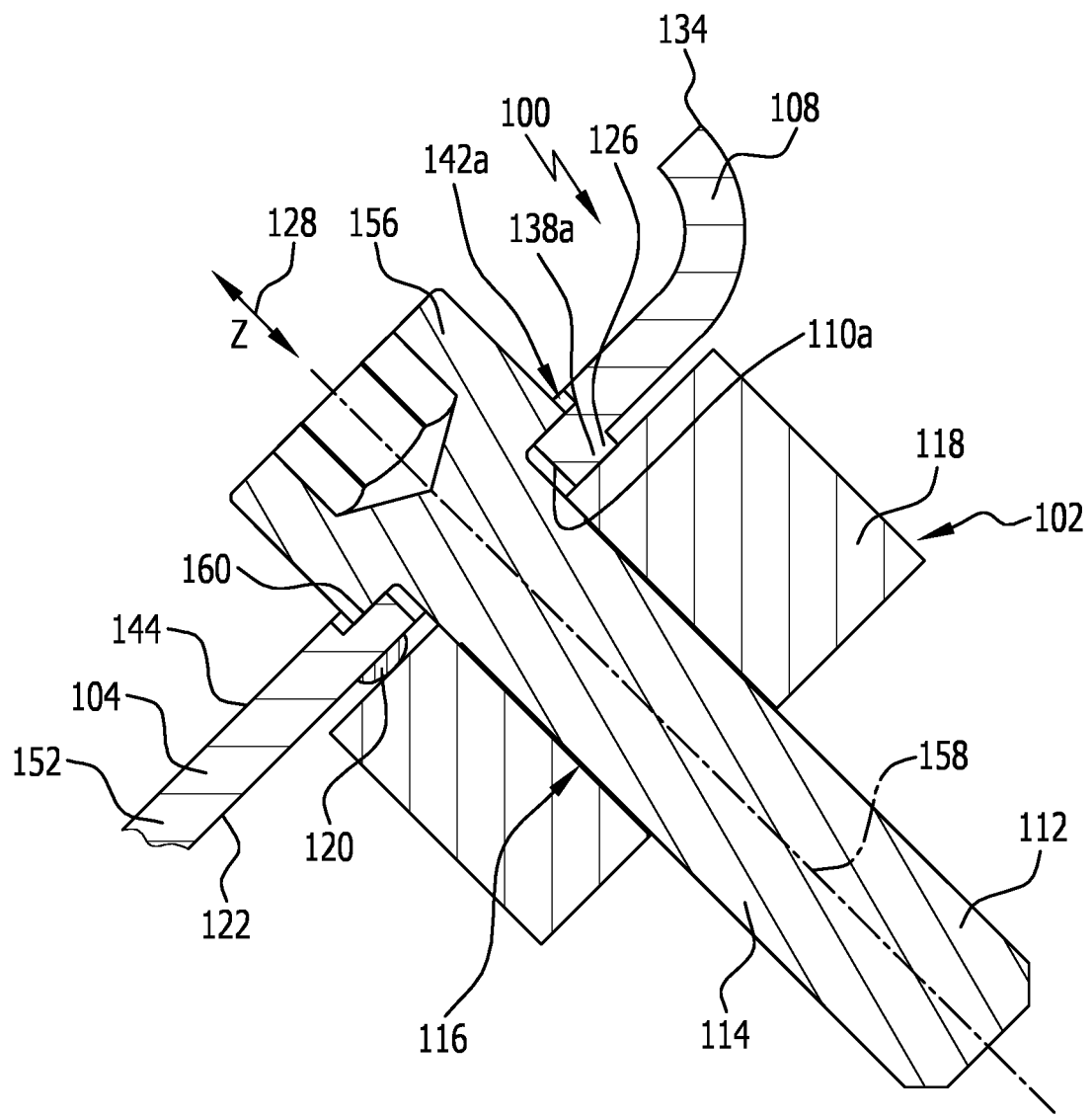
FIG. 15 shows a sectional cross section through the housing cover, a region of the housing, and a fastening means, by means of which the housing cover is releasably fixed to the housing, along line 14-14 in FIG. 4, in a pressed state of the sealing bead.

As can best be seen in FIGS. 14 and 15, the portion 138*a* of the deformation limiting element 126*b* extends directly up to the rim of the fastening means through-opening 110*a*, such that in the assembled state of the housing cover 100 (see FIG. 15), at least part of the deformation limiting element 126 is clamped between the head 156 of the associated fastening screw 114 and the housing 102 and is pressed on block.

The recess 142*a* associated with the portion 138*a* of the deformation limiting element 126*b* is preferably configured substantially rotationally symmetrical to the longitudinal central axis 158 of the fastening means through-opening 110*a* and reaches up to the rim of the fastening means through-opening 110*a*, such that the fastening means through-opening 110*a* opens in the recess 142*a*.

In the assembled state of the housing cover 100, the fastening screw 114 abuts, preferably substantially in surface-to-surface contact, on a base 160 of the recess 142*a* surrounding the fastening means through-opening 110*a*.

The sealing bead 120 overlaps at least partially, seen in the Z-direction 128, with a part of the recess 142*a*, opposite which no region of the deformation limiting element 126 is located on the seal bearing surface 122, and with the head 156 of the fastening screw 114.

In this way, at least part of the sealing bead 120 is pressed directly between the head 156 of the fastening screw 114 and the housing 102, which leads to a particularly high contact pressure of the sealing bead 120 in this region and thus a particularly high sealing force.

Another part of the sealing bead 120 extends in the radial direction of the fastening means through-opening 110*a* outwardly beyond the recess 142*a* and beyond the head 156 of the fastening screw 114.

Figure 5:
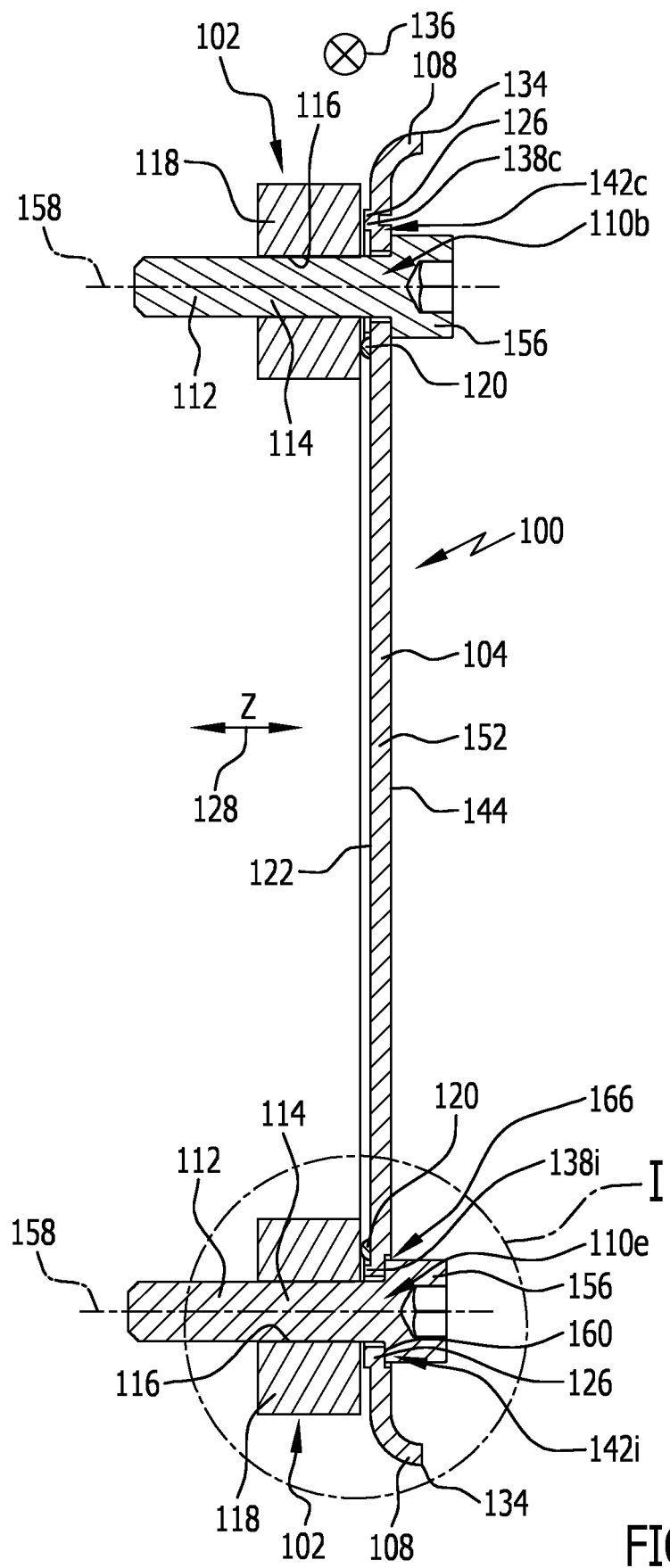
FIG. 5 shows a cross section through the housing cover from FIGS. 1 to 4 through a region of a housing at which the housing cover is arranged, and through fastening means for releasably fixing the housing cover to the housing, in an non-pressed state of the sealing bead.

In the portion 138*c* of the deformation limiting element 126*b*, as can be seen in the upper part of FIG. 5, the deformation limiting element 126 and/or the recess 142*c* associated with same do not extend directly up to the rim of the fastening means through-opening 110*b*.

In the assembled state of the housing cover 100, the deformation limiting element 126 and/or the recess 142 associated with same are therefore preferably located radially outside the head 156 of the fastening screw 114 (in relation to the longitudinal central axis 158 of the fastening means through-opening 110*b*).

In the region of the fastening means through-opening 110*b*, the sealing bead 120 is preferably also located radially outside the head 156 of the fastening screw 114.

Figure 9:
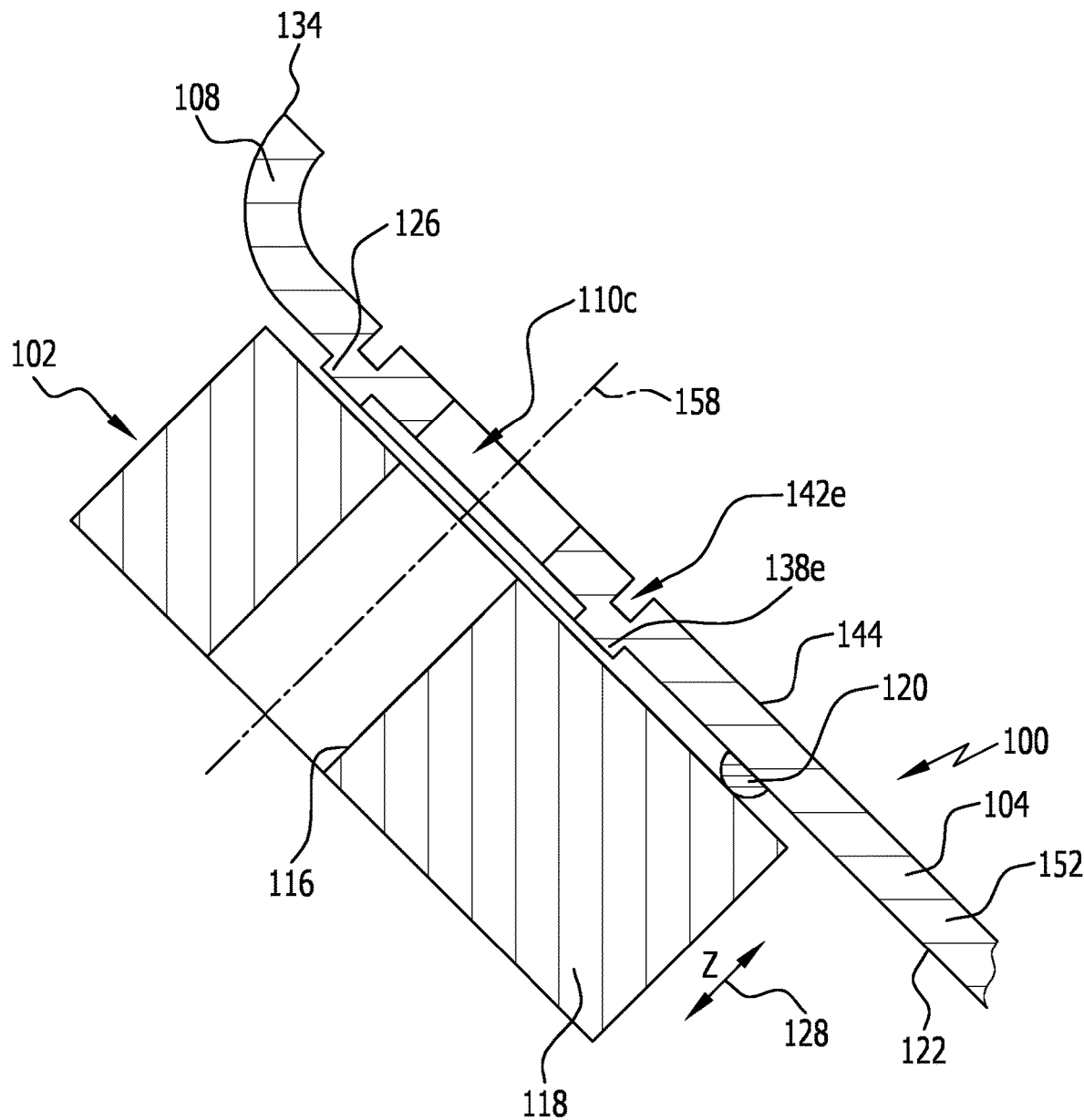
FIG. 9 shows a sectional cross section through the housing cover and a region of the housing along line 9-9 in FIG. 4, in a non-pressed state of the sealing bead.
Figure 10:
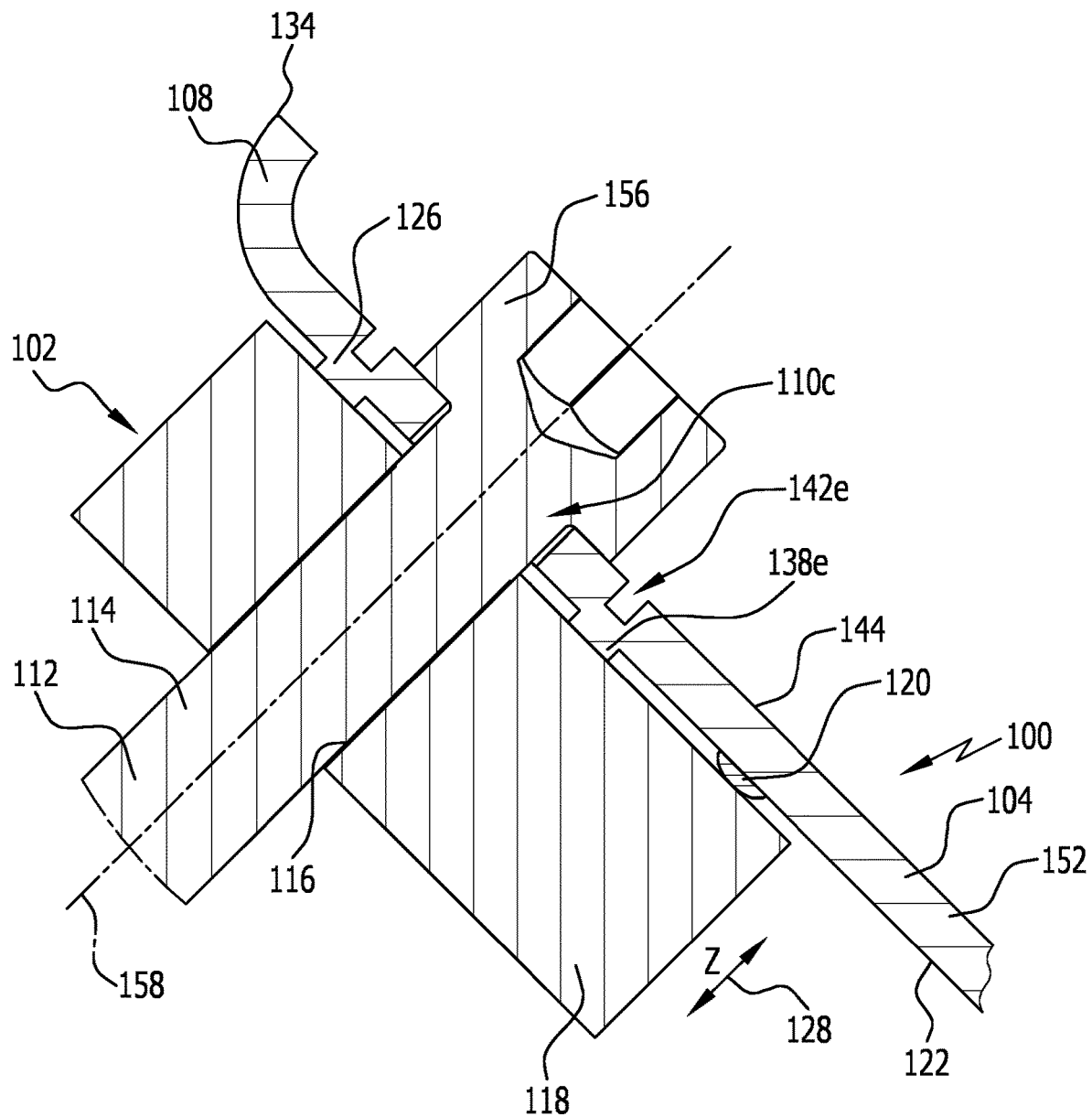
FIG. 10 shows a sectional cross section through the housing cover, a region of the housing, and a fastening means, by means of which the housing cover is releasably fixed to the housing, along line 9-9 in FIG. 4, in a non-pressed state of the sealing bead.

The portion 138*e* of the deformation limiting element 126*b* extends at a distance from the rim of the fastening means through-opening 110*c* in an annularly closed manner around the fastening means through-opening 110*c* (see FIGS. 9 and 10).

The recess 142 associated with the deformation limiting element 126 also runs at a distance from the fastening means through-opening 110*c* in an annularly closed manner around same.

In the assembled state of the housing cover 100, the deformation limiting element 126 and/or the recess 142 associated with the deformation limiting element 126 are preferably located radially outside the head 156 of the fastening screw 114 (in relation to the longitudinal central axis 158 of the fastening means through-opening 110*c*) in the region of the fastening means through-opening 110*c*.

The sealing bead 120 in the region of the fastening means through-opening 110*c* is arranged radially outside the deformation limiting element 126 and/or radially outside the recess 142 associated with the deformation limiting element 126.

In the region of the fastening means through-opening 110*d*, the portion 138*g* of the deformation limiting element 126*b* extends in an annularly closed manner around the fastening means through-opening 110*d*.

Figure 12:
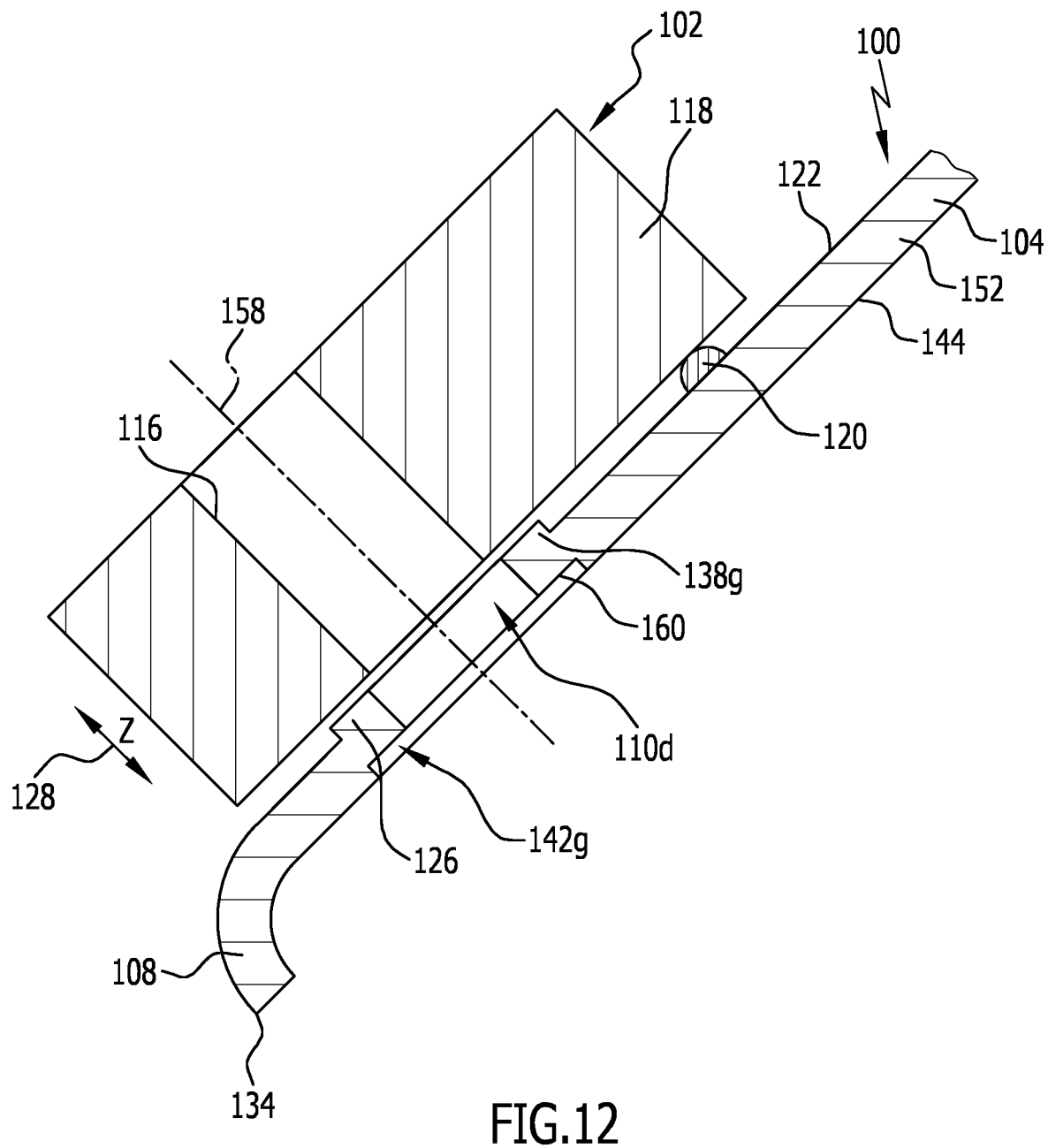
FIG. 12 shows a sectional cross section through the housing cover and a region of the housing along line 12-12 in FIG. 4, in a non-pressed state of the sealing bead.
Figure 13:
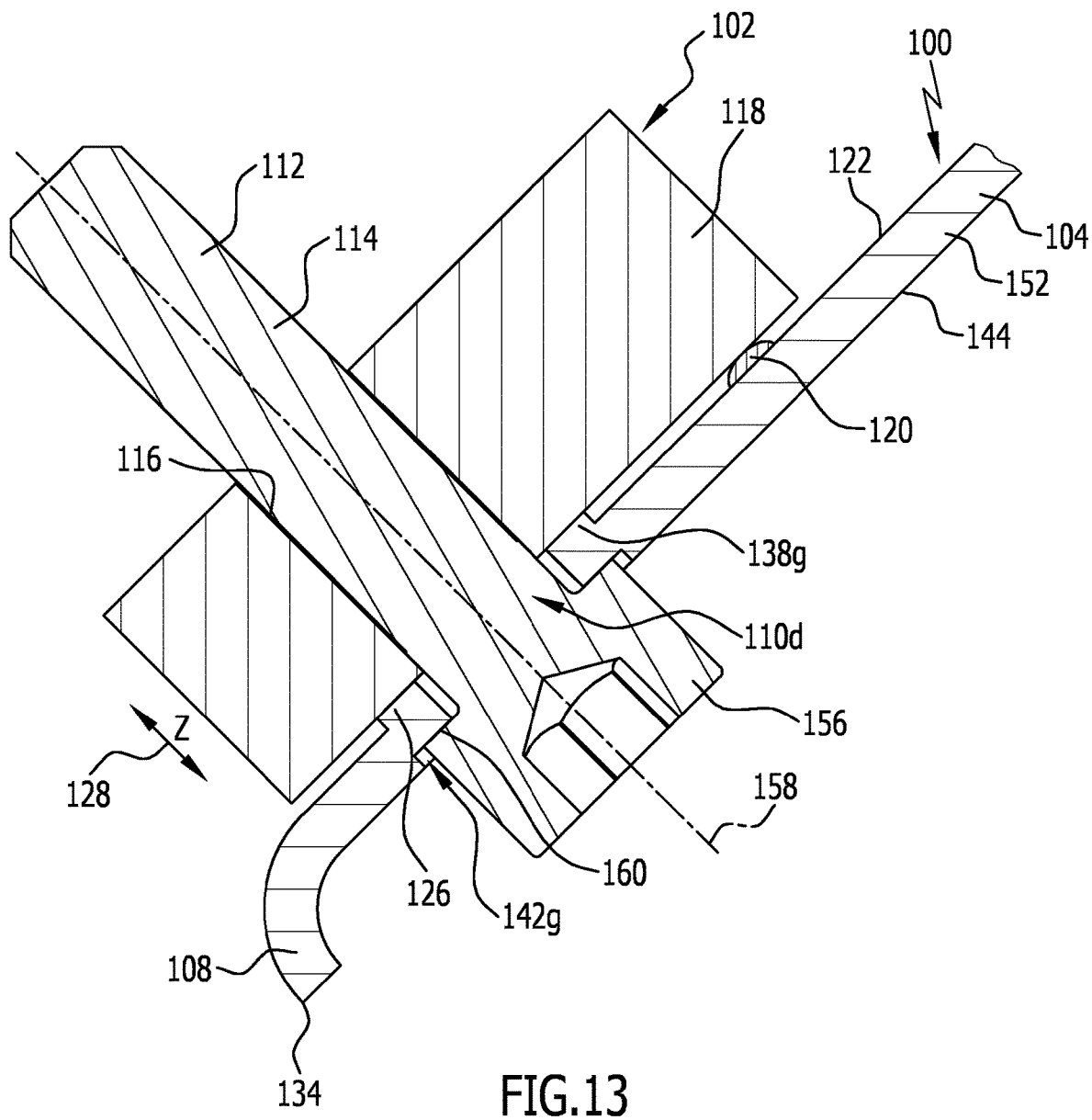
FIG. 13 shows a sectional cross section through the housing cover, a region of the housing, and a fastening means, by means of which the housing cover is releasably fixed to the housing, along line 12-12 in FIG. 4, in a pressed state of the sealing bead.

The deformation limiting element 126 thereby reaches directly up to the rim of the fastening means through-opening 110*d* (see FIGS. 12 and 13).

The recess 142*g* associated with the deformation limiting element 126 is configured substantially rotationally symmetrical to the longitudinal central axis 158 of the fastening means through-opening 110d.

The fastening means through-opening 110d opens into the recess 142g.

In the pressed state of the housing cover 100 (see FIG. 13), the deformation limiting element 126 is arranged between the head 156 of the fastening screw 114 and the housing 102 and is pressed by the fastening screw 114 directly on block.

In the region of the fastening means through-opening 110d, the sealing bead 120 is located radially outside the head 156 of the fastening screw 114 (in relation to the longitudinal central axis 158 of the fastening means through-opening 110d).

In the region of the fastening means through-opening 110e, the portion 138i of the deformation limiting element 126b extends in an annularly closed manner around the fastening means through-opening 110e.

Figure 6:
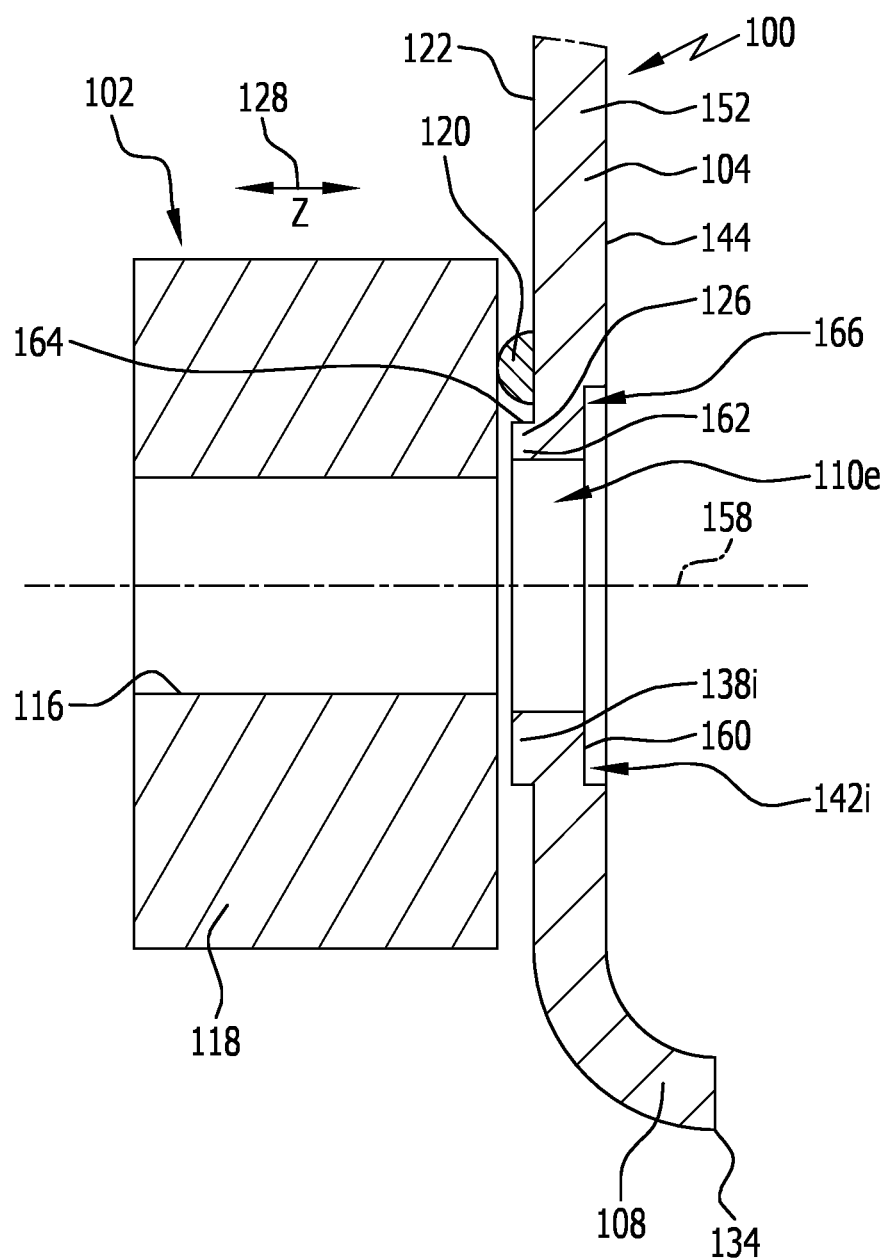
FIG. 6 shows an enlarged depiction of region I from FIG. 5, without the fastening means, in a non-pressed state of the sealing bead.
Figure 7:
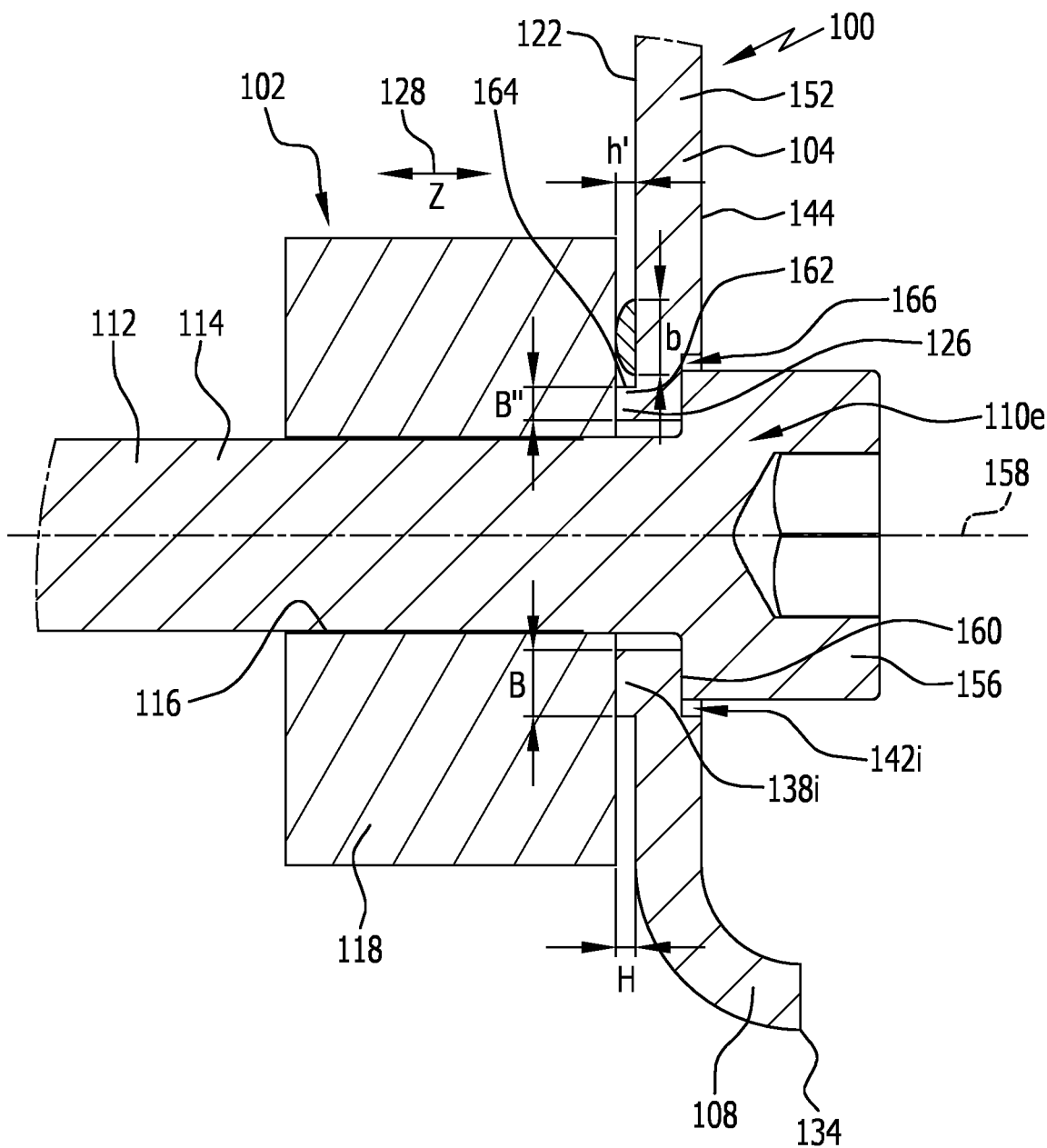
FIG. 7 shows a depiction of region I from FIG. 5 in a pressed state of the sealing bead.
Figure 8:
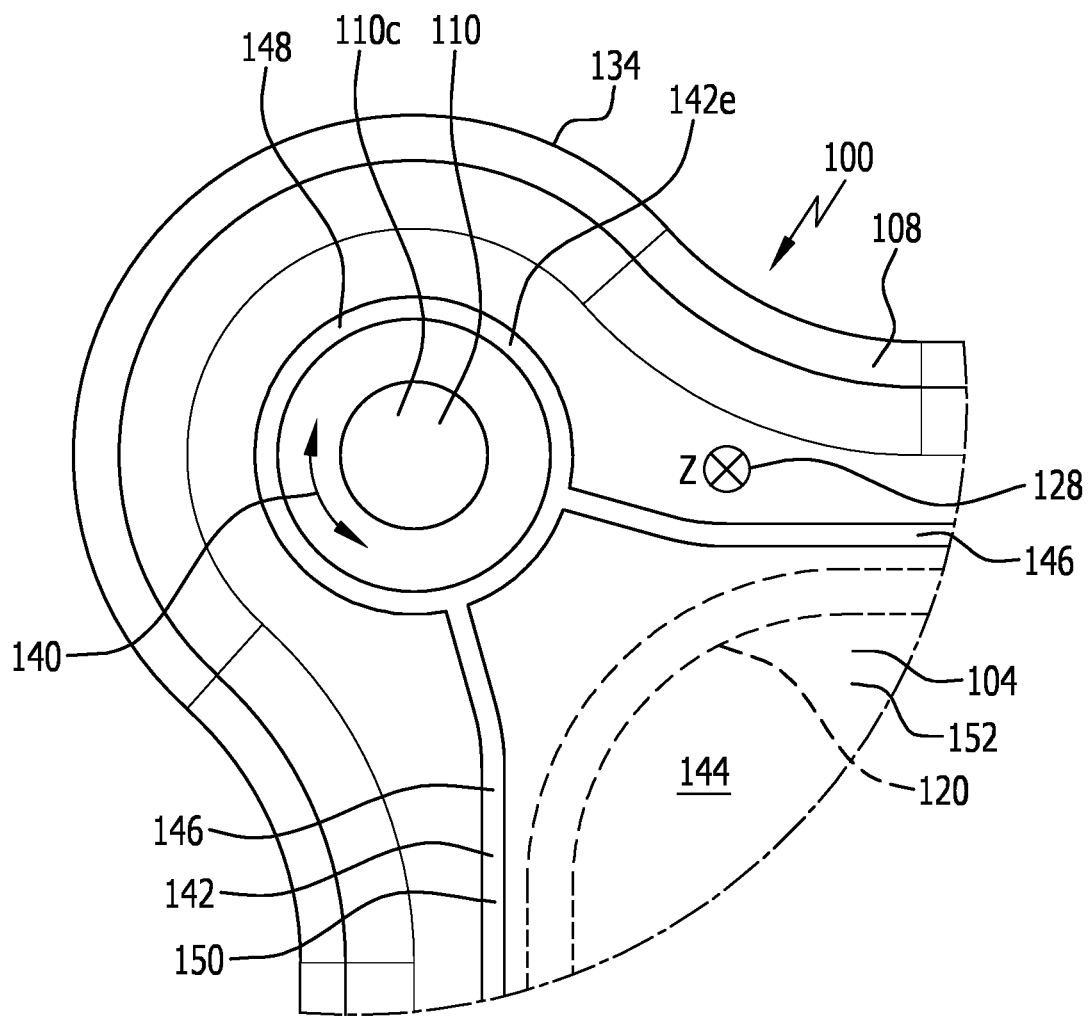
FIG. 8 shows an enlarged depiction of region II from FIG. 4.

The deformation limiting element 126 extends directly up to the rim of the fastening means through-opening 110e (see the lower part of FIG. 5 as well as FIGS. 6 and 7).

In the pressed state of the housing cover 100 (see FIG. 7), at least part of the deformation limiting element 126 is arranged between the head 156 of the fastening screw 114 and the housing 102, such that the deformation limiting element 126 is directly pressed by the fastening screw 114 on block.

The recess 142i associated with the deformation limiting element 126 is configured substantially rotationally symmetrical to the longitudinal central axis 158 of the fastening means through-opening 110e.

The fastening means through-opening 110e opens into the recess 142i.

In the pressed state of the housing cover 100 (see FIG. 7), the head 156 of the fastening screw 114 abuts on the base 160 of the recess 142i.

The deformation limiting element 126 has a reduced width B" in a region 162, which is located between the fastening means through-opening 110e on the one hand and the sealing bead 120 on the other hand, which makes it possible to bring the sealing bead 120 in this region as close as possible to the fastening means through-opening 110e and to the fastening screw 114.

Further, in this region 162, the deformation limiting element 126 may have a substantially rectilinear rim 164, preferably running substantially in parallel to the sealing bead 120.

The recess 142 associated with the deformation limiting element 126 and extending around the same fastening means through-opening 110 comprises a (preferably circular cylinder segment-shaped) region 166, which, seen in the Z-direction 128, does not overlap with the deformation limiting element 126.

To avoid that the reduced width B" of the deformation limiting element 126 in the region 162 leads to an inadmissibly high surface pressure in the assembled state of the housing cover 100, provision may be made for another region of the deformation limiting element 126, which extends around the same fastening means through-opening 110e, to have a greater width, and/or for the deformation limiting element 126 to comprise a region, which adjoins the region 162 of the deformation limiting element 126, which as a reduced width B", in a direction running substantially in parallel to the sealing bead 120.

The sealing bead 120 preferably overlaps, seen in the Z-direction 128, with the recess 142i and/or with the head 156 of the fastening screw 114 (see FIG. 7).

This makes it possible to act on the sealing bead 120 in this region with a particularly high contact pressure and thus to produce a particularly high sealing force.

Different alternative embodiments of the portion 138i of the deformation limiting element 126b are depicted in FIGS. 16 to 19.

This portion 138i of the deformation limiting element 126 may thereby be spaced at a distance from the adjacent portions 132h and/or 132i of the deformation limiting element 126 or be connected to same.

Figure 16:
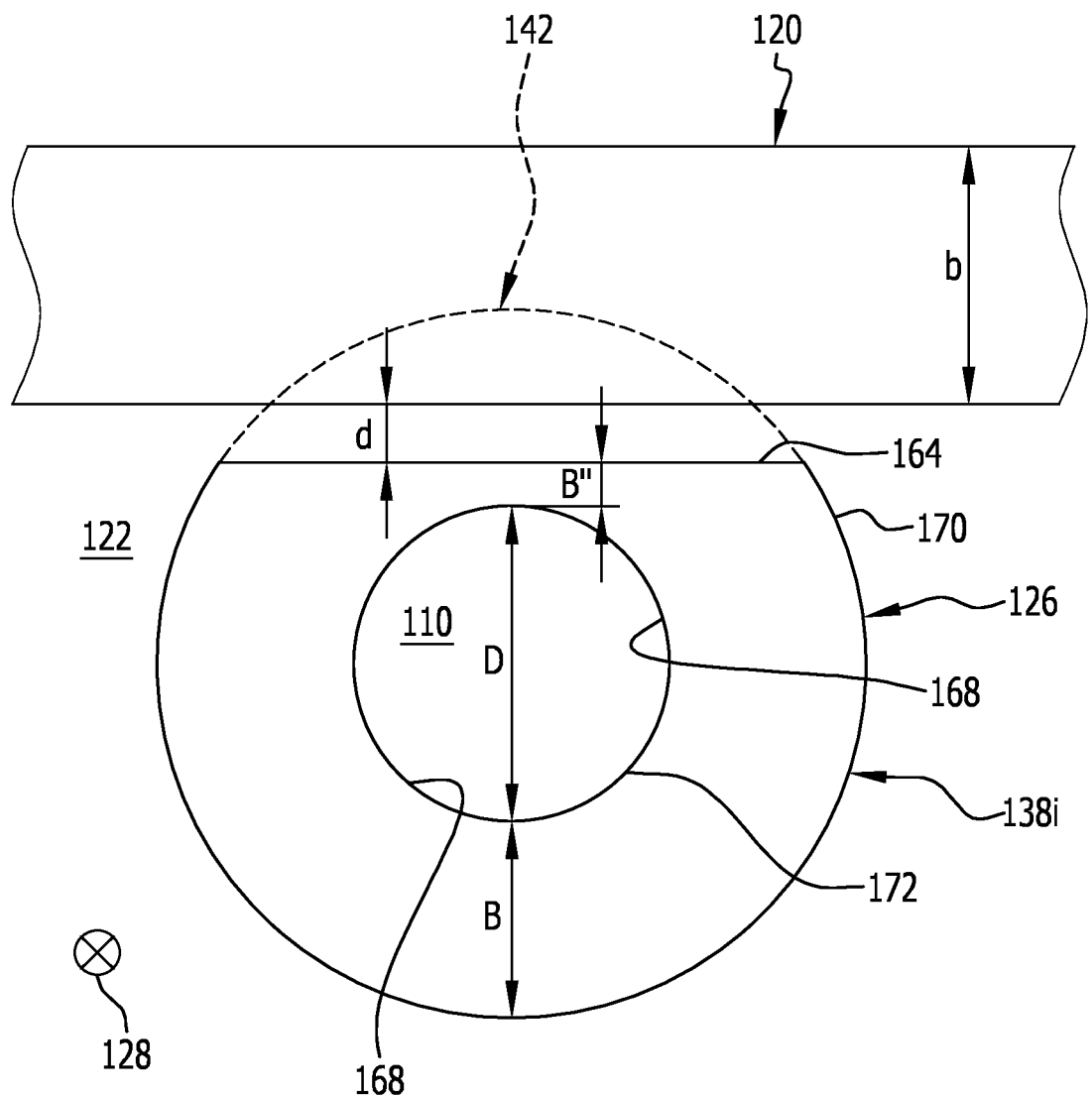
FIG. 16 shows a plan view of the seal bearing surface of the housing cover, which shows a portion of a deformation limiting element that extends around a fastening means through-opening and has a smaller width B" on the side of the fastening means through-opening facing toward the sealing bead than on the side of the fastening means through-opening facing away from the sealing bead.

The portion 138i of the deformation limiting element 126, which extends along the circumferential direction 140 of the fastening means through-opening 110e entirely or partially around the fastening means through-opening 110, may have a maximum width B and a minimum width B" (see FIG. 16). The width B and B" respectively hereby correspond to the distance between an inner rim 168 facing toward the fastening means through-opening and an outer rim 170 of the portion 138i of the deformation limiting element 126, facing away from the fastening means through-opening.

The inner rim 168 of the portion 138i of the deformation limiting element 126 may hereby coincide with the rim 172 of the fastening means through-opening 110.

The maximum width B of the portion 138i of the deformation limiting element 126 is preferably at most 100% of the diameter D of the fastening means through-opening 110, in particular at most 60% of the diameter D of the fastening means through-opening 110, particularly preferably at most 20% of the diameter D of the fastening means through-opening 110.

The minimum width B" of the portion 138i of the deformation limiting element 126 is preferably less than 50% of the maximum width B of the portion 138i of the deformation limiting element 126.

Figure 17:
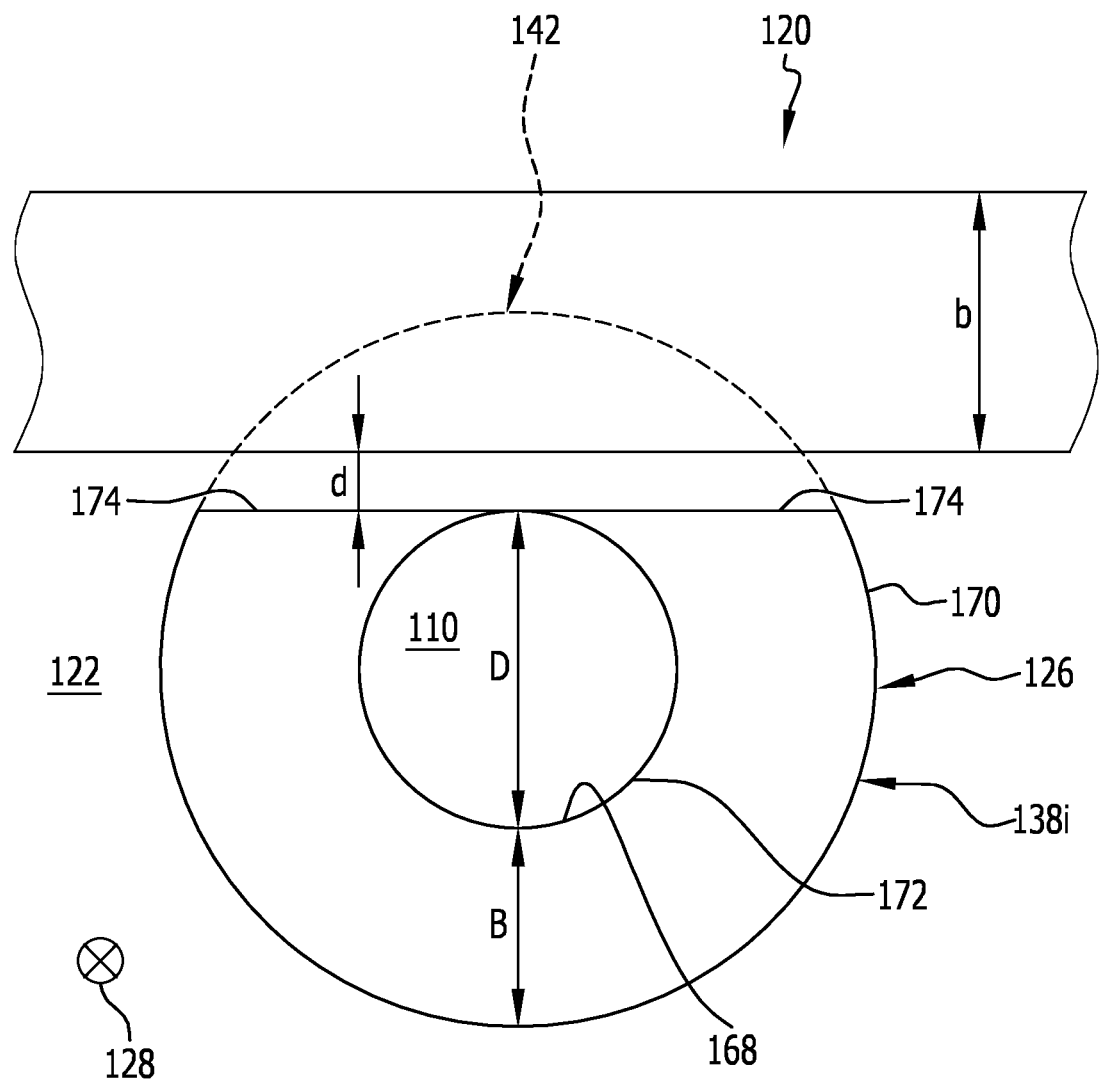
FIG. 17 shows a plan view of an alternative embodiment of the portion of the deformation limiting element from FIG. 16, in which rim portions of the deformation limiting element connecting an inner rim and an outer rim of the portion of the deformation limiting element to one another run substantially tangentially to the rim of the fastening means through-opening.

In the alternative embodiment depicted in FIG. 17, rim portions 174 connecting the inner rim 168 and the outer rim 170 of the portion 138i of the deformation limiting element 126 to one another are arranged substantially tangentially to the fastening means through-opening 110.

In this case, the minimum width B" of the portion 138i of the deformation limiting element 126 is equal to zero.

Figure 18:
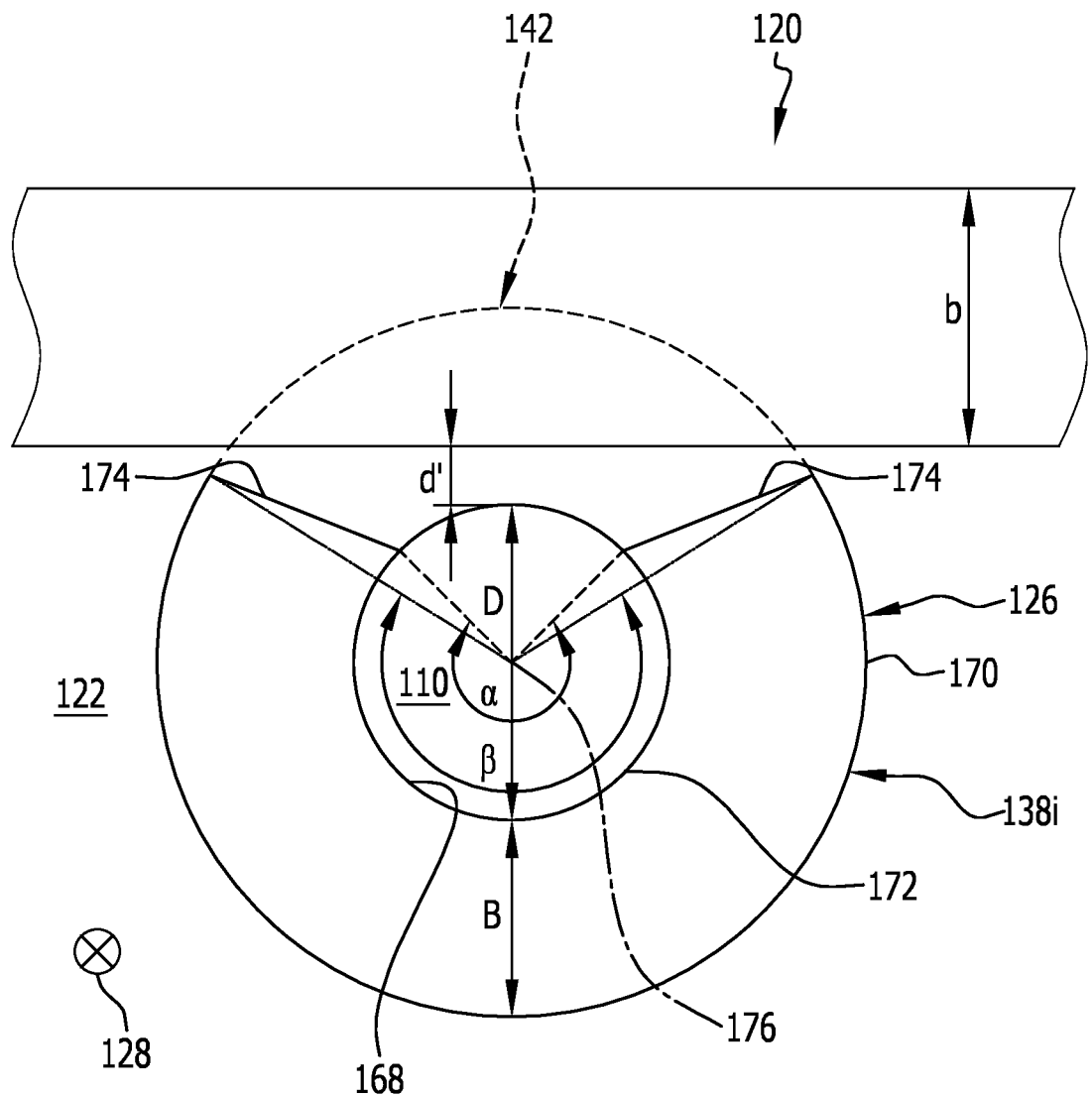
FIG. 18 shows a plan view of an alternative embodiment of the portion of the deformation limiting element from FIGS. 16 and 17, in which the inner rim of the portion of the deformation limiting element extends along a circumferential angle α around the central axis of the fastening means through-opening and the outer rim of the portion of the deformation limiting element extends along a circumferential angle β around the central axis of the fastening means through-opening, wherein the circumferential angle α is greater than the circumferential angle β and both circumferential angles α and β are smaller than 360'.

In the alternative embodiment depicted in FIG. 18, the inner rim 168 of the portion 138i of the deformation limiting element 126 extends over a circumferential angle α (in relation to the central axis 176 of the fastening means through-opening 110) of 360° or less, preferably 320° or less, in particular 270° or less, particularly preferably 180° or less.

The outer rim 170 of the portion 138i of the deformation limiting element 126 extends over a circumferential angle β (in relation to the central axis 176 of the fastening means through-opening 110) of 360° or less, preferably 320° or less, in particular 270° or less, particularly preferably 180° or less.

The circumferential angle α along which the inner rim 168 of the portion 138i of the deformation limiting element 126 extends around the fastening means through-opening 110 may, as shown in FIGS. 16 and 17, be substantially equal to the circumferential angle β along which the outer rim 170 of the portion 138i of the deformation limiting element 126 extends around the fastening means through-opening 110. In this case, the rim portions 174, which connect the inner rim 168 and the outer rim 170 of the portion 138i of the deformation limiting element 126 to one another, may be oriented substantially radially to the central axis 176 of the fastening means through-opening 110.

Figure 19:
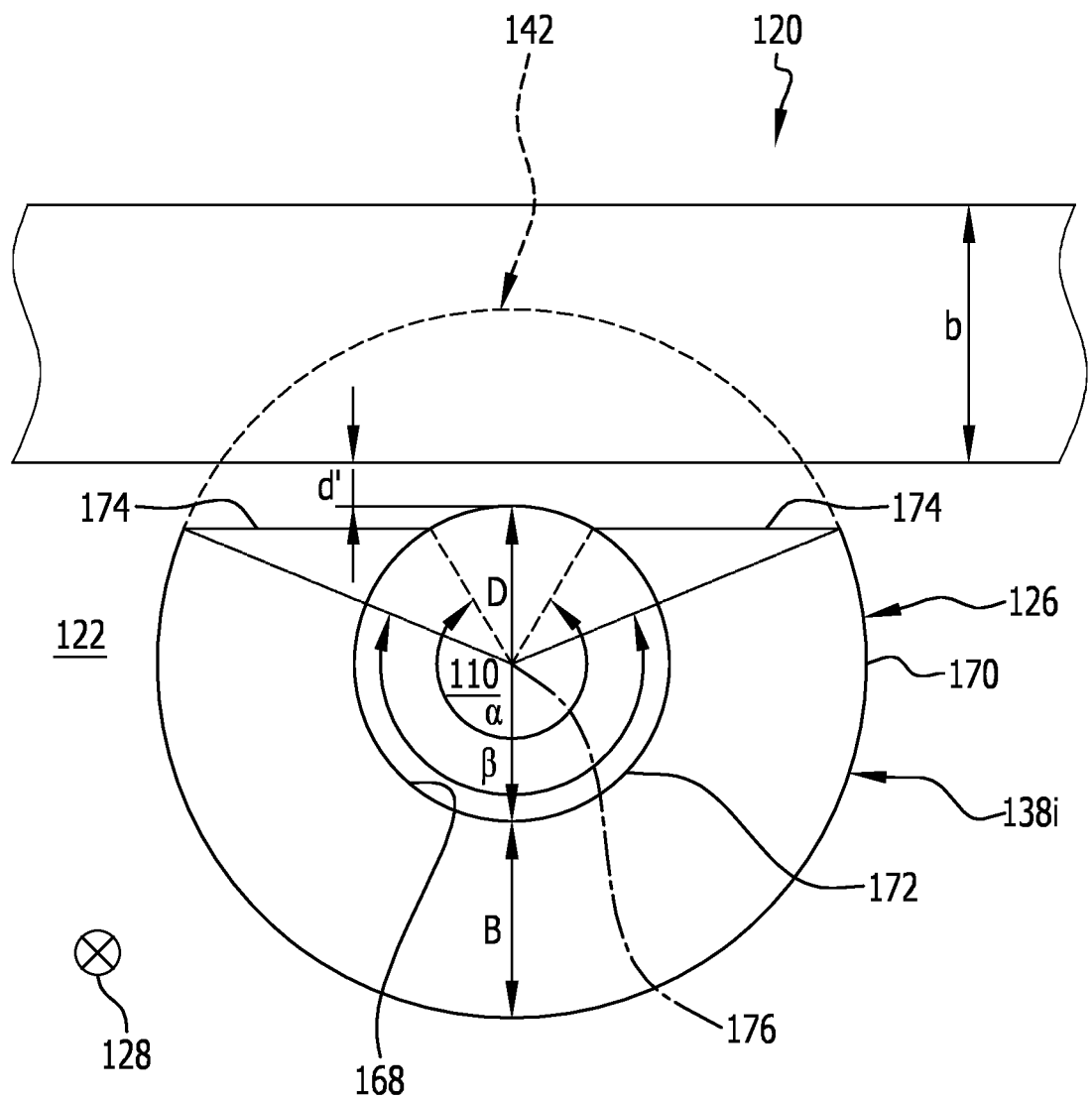
FIG. 19 shows a plan view of an alternative embodiment of the portion of the deformation limiting element from FIG. 18, in which the rim portions that connect the inner rim and the outer rim of the portion of the section of the deformation limiting element to one another run substantially in parallel to a rim of the sealing bead.

In the embodiments of the deformation limiting element 126 depicted in FIGS. 18 and 19, however, provision is made for the circumferential angle α to be greater than the circumferential angle β. In this case, the rim portions 174 of the deformation limiting element 126, which connect the inner rim 168 to the outer rim 170 of the deformation limiting element 126, are oriented non-radially in relation to the central axis 176 of the fastening means through-opening 110.

In the embodiment depicted in FIG. 19, provision is made for the rim portions 174 of the portion 138i of the deformation limiting element 126, which connect the inner rim 168 and the outer rim 170 of the portion 138i of the deformation limiting element 126 to one another, to be oriented substantially in parallel to the sealing bead 120.

The distance d of the sealing bead 120 from the portion 138i of the deformation limiting element 126 is preferably at least 0.5 mm, in particular at least 0.7 mm, particularly preferably at least 1.0 mm.

If the portion 138i of the deformation limiting element 126 does not extend completely around the fastening means through-opening 110, the distance d' of the sealing bead 120 from the rim 172 of the fastening means through-opening 110 is preferably smaller in sections than the distance d of the sealing bead 120 from the deformation limiting element 126 (see FIGS. 18 and 19).

In this case, the distance d' of the sealing bead 120 from the rim 172 of the fastening means through-opening 110 is preferably at least 0.5 mm, in particular at least 0.7 mm, particularly preferably at least 1.0 mm.

In the portion 132j of the deformation limiting element 126b, the deformation limiting element 126 runs substantially in parallel to the sealing bead 120 and/or substantially in parallel to an outer rim 134 of the housing cover 100 (see FIGS. 1 and 3).

The distance d between the sealing bead 120 and the deformation limiting element 126 in this portion is preferably smaller than the width b of the sealing bead 120 and/or preferably smaller than the width B of the deformation limiting element 126 (see FIG. 11).

In the region of the fastening means through-opening 110f, the deformation limiting element 126 runs at a distance from the rim of the fastening means through-opening 110f (see FIG. 3).

The recess 142k associated with the deformation limiting element 126 also does not reach up to the rim of the fastening means through-opening 110f (see FIG. 4).

To produce the housing cover described above, one proceeds, for example, as follows:

In a follow-on composite tool, the housing cover 100 with the desired outer contour and the fastening means through openings 110 is punched out of a sheet of a metallic material, in particular out of an aluminum sheet.

Further, the housing cover 100 is provided with the deformation limiting elements 126 and the recesses 142 associated with same, optionally with the topography of the deformation limiting elements 126 described above, in the follow-on composite tool by means of suitable shaping tools.

Then, the sealing bead 120 made from the elastomeric material is produced on the seal bearing surface 122 by means of a dispenser application method ("cured in place" method) or by means of a screen printing method.

The housing cover 100 is suited, in particular, to close a housing 102 of a power inverter, in particular a power inverter of an electric drive device, for example an electric drive device of an electric car.

The invention claimed is:

1. A housing cover for fixing to a housing, in particular a power inverter housing,
    wherein the housing cover is provided with a plurality of fastening means through-openings and with a sealing bead, which comprises an elastomeric material,
    wherein the sealing bead is arranged on a seal bearing surface of the housing cover,
    wherein the housing cover comprises at least one deformation limiting element, which projects over the seal bearing surface in the same direction as the sealing bead and limits a deformation of the sealing bead in the assembled state of the housing cover, and
    wherein at least one portion of at least one deformation limiting element extends along the circumferential direction of a fastening means through-opening by a circumferential angle of at least 160° around the fastening means through-opening.

2. The housing cover in accordance with claim 1, wherein the deformation limiting element is produced by reshaping a base body of the housing cover.

3. The housing cover in accordance with claim 1, wherein at least one portion of at least one deformation limiting element extends in an annularly closed manner around a fastening means through-opening.

4. The housing cover in accordance with claim 1, wherein at least one portion of at least one deformation limiting element is arranged on a side of a fastening means through-opening that faces away from the sealing bead.

5. The housing cover in accordance with claim 4, wherein the at least one portion of the at least one deformation limiting element is arranged between the fastening means through-opening and an outer rim of the housing cover.

6. The housing cover in accordance with claim 1, wherein on the housing cover a plurality of deformation limiting elements are provided, which extend along a peripheral direction of the housing cover and are spaced at a distance from one another along the peripheral direction.

7. The housing cover in accordance with claim 1, wherein the sealing bead is of annularly closed configuration.

8. The housing cover in accordance with claim 7, wherein a region of the seal bearing surface that is surrounded by the sealing bead is of substantially planar configuration.

9. The housing cover in accordance with claim 1, wherein the deformation limiting element comprises a projection extending in a longitudinal direction of the deformation limiting element.

10. The housing cover in accordance with claim 1, wherein a recess on the outside of the housing cover facing away from the seal bearing surface is associated with the deformation limiting element.

11. The housing cover in accordance with claim 1, wherein at least one fastening means through-opening of the housing cover opens into a recess that is associated with a deformation limiting element.

12. The housing cover in accordance with claim 1, wherein a fastening means passing through a fastening means through-opening of the housing cover in the assembled state of the housing cover abuts on a recess surrounding the respective fastening means through opening.

13. The housing cover in accordance with claim 1, wherein the sealing bead is configured and/or arranged such that a portion of the sealing bead, seen in a Z-direction oriented perpendicularly to the seal bearing surface, is overlapped across its entire width or over part of its width by a recess surrounding a fastening means through-opening.

14. The housing cover in accordance with claim 1, wherein the sealing bead runs at least in sections at a distance from the deformation limiting element, which distance is smaller than at least one of the width of the sealing bead and the width of the deformation limiting element.

15. The housing cover in accordance with claim 1, wherein the width of the deformation limiting element is smaller than four times the width of the sealing bead.

16. The housing cover in accordance with claim 1, wherein the seal bearing surface comprises a substantially planar region, which bears the sealing bead and on the side facing away from the deformation limiting element has a width, which is greater than the width of the sealing bead.

17. The housing cover in accordance with claim 1, wherein a base body of the housing cover on which the sealing bead is arranged is configured as a shaped sheet metal part.

18. The housing cover in accordance with claim 1, wherein a rim region of the housing cover running on the side of the deformation limiting element facing away from the sealing bead has a bend.

19. Housing cover for fixing to a housing, in particular a power inverter housing,
wherein the housing cover is provided with a plurality of fastening means through-openings and with a sealing bead, which comprises an elastomeric material,
wherein the sealing bead is arranged on a seal bearing surface of the housing cover,
wherein the housing cover comprises at least one deformation limiting element, which projects over the seal bearing surface in the same direction as the sealing bead and limits a deformation of the sealing bead in the assembled state of the housing cover,
wherein at least one portion of at least one deformation limiting element is arranged on a side of a fastening means through-opening that faces away from the sealing bead and
wherein the at least one portion of the at least one deformation limiting element is arranged between the fastening means through-opening and an outer rim of the housing cover.

20. Housing cover for fixing to a housing, in particular a power inverter housing,
wherein the housing cover is provided with a plurality of fastening means through-openings and with a sealing bead, which comprises an elastomeric material,
wherein the sealing bead is arranged on a seal bearing surface of the housing cover,
wherein the housing cover comprises at least one deformation limiting element, which projects over the seal bearing surface in the same direction as the sealing bead and limits a deformation of the sealing bead in the assembled state of the housing cover,
wherein on the housing cover a plurality of deformation limiting elements are provided, which extend along a peripheral direction of the housing cover and are spaced at a distance from one another along the peripheral direction.

21. Housing cover for fixing to a housing, in particular a power inverter housing,
wherein the housing cover is provided with a plurality of fastening means through-openings and with a sealing bead, which comprises an elastomeric material,
wherein the sealing bead is arranged on a seal bearing surface of the housing cover,
wherein the housing cover comprises at least one deformation limiting element, which projects over the seal bearing surface in the same direction as the sealing bead and limits a deformation of the sealing bead in the assembled state of the housing cover,
wherein the deformation limiting element comprises a projection extending in a longitudinal direction of the deformation limiting element.

22. Housing cover for fixing to a housing, in particular a power inverter housing,
wherein the housing cover is provided with a plurality of fastening means through-openings and with a sealing bead, which comprises an elastomeric material,
wherein the sealing bead is arranged on a seal bearing surface of the housing cover,
wherein the housing cover comprises at least one deformation limiting element, which projects over the seal bearing surface in the same direction as the sealing bead and limits a deformation of the sealing bead in the assembled state of the housing cover,
wherein a recess on the outside of the housing cover facing away from the seal bearing surface is associated with the deformation limiting element.

* * * * *